(12) United States Patent
Goethals et al.

(10) Patent No.: US 12,403,686 B2
(45) Date of Patent: Sep. 2, 2025

(54) LITHOGRAPHIC PRINTING PLATE PRECURSOR

(71) Applicant: ECO3 BV, Mortsel (BE)

(72) Inventors: Fabienne Goethals, Mortsel (BE); Marieke Van Remoortere, Mortsel (BE); Thomas Billiet, Mortsel (BE); Katleen Himschoot, Mortsel (BE)

(73) Assignee: ECO3 BV, Mortsel (BE)

( * ) Notice: Subject to any disclaimer, the term of this patent is extended or adjusted under 35 U.S.C. 154(b) by 119 days.

(21) Appl. No.: 18/248,370

(22) PCT Filed: Sep. 30, 2021

(86) PCT No.: PCT/EP2021/076986
§ 371 (c)(1),
(2) Date: Apr. 7, 2023

(87) PCT Pub. No.: WO2022/073849
PCT Pub. Date: Apr. 14, 2022

(65) Prior Publication Data
US 2023/0382100 A1    Nov. 30, 2023

(30) Foreign Application Priority Data

Oct. 9, 2020 (EP) .................................. 20201023

(51) Int. Cl.
*B41C 1/10* (2006.01)
*G03F 7/085* (2006.01)
*G03F 7/16* (2006.01)

(52) U.S. Cl.
CPC .......... *B41C 1/1025* (2013.01); *B41C 1/1091* (2013.01); *G03F 7/085* (2013.01); *B41C 2210/04* (2013.01)

(58) Field of Classification Search
CPC ....................................................... G03F 7/16
See application file for complete search history.

(56) References Cited

U.S. PATENT DOCUMENTS

2010/0248140 A1    9/2010  Kuramoto
2017/0075223 A1    3/2017  Steenackers et al.

FOREIGN PATENT DOCUMENTS

| EP | 0851299 A1 | 7/1998 | |
|---|---|---|---|
| EP | 1008910 A1 | 6/2000 | |
| EP | 1091251 A2 | 4/2001 | |
| EP | 1495866 A2 | 1/2005 | |
| EP | 1500498 A2 | 1/2005 | |
| EP | 1520694 A2 | 4/2005 | |
| EP | 2112555 A2 | 10/2009 | |
| EP | 2236291 A1 * | 10/2010 | ........... B41C 1/1008 |
| GB | 1432201 A | 4/1976 | |
| WO | WO-2022073774 A1 * | 4/2022 | ........... C09D 11/101 |

OTHER PUBLICATIONS

European Patent Office, International Search Report in International Patent Application No. PCT/EP2021/076986, mailed Jan. 4, 2022, 3 pp.
European Patent Office, Written Opinion in International Patent Application No. PCT/EP2021/076986, mailed Jan. 4, 2022, 6 pp.

* cited by examiner

*Primary Examiner* — Chanceity N Robinson
(74) *Attorney, Agent, or Firm* — Leydig, Voit & Mayer, Ltd.

(57) ABSTRACT

A lithographic printing plate precursor including on a substrate which has a hydrophilic surface or which is provided with a hydrophilic layer, a coating comprising a photopolymerisable layer including a polymerisable compound, a photoinitiator and adhesion promoting compound containing at least one thiol group and at least one group capable of adhering to the substrate.

20 Claims, No Drawings

LITHOGRAPHIC PRINTING PLATE PRECURSOR

CROSS-REFERENCE TO RELATED APPLICATIONS

This patent application is the U.S. national stage of copending International Patent Application No. PCT/EP2021/076986, filed Sep. 30, 2021, which claims the benefit of European Patent Application No. 20201023.7, filed Oct. 9, 2020.

TECHNICAL FIELD

The invention relates to a novel lithographic printing plate precursor.

BACKGROUND ART

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Lithographic printing masters are generally obtained by the image-wise exposure and processing of a radiation sensitive layer on a lithographic support. Imaging and processing renders the so-called lithographic printing plate precursor into a printing plate or master. Image-wise exposure of the radiation sensitive coating to heat or light, typically by means of a digitally modulated exposure device such as a laser, triggers a physical and/or chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or difference in rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, hence printing areas of the plate while the hydrophilic support is revealed by the dissolution of the coating in the developer at the non-printing areas.

Photopolymer printing plates rely on a working-mechanism whereby the coating—which typically includes free radically polymerisable compounds—hardens upon exposure. "Hardens" means that the coating becomes insoluble or non-dispersible in the developing solution and may be achieved through polymerization and/or crosslinking of the photosensitive coating upon exposure to light and/or heat. Photopolymer plate precursors can be sensitized to blue, green or red light i.e. wavelengths ranging between 450 and 750 nm, to violet light i.e. wavelengths ranging between 300 and 450 nm or to infrared light i.e. wavelengths ranging between 750 and 1500 nm. Optionally, the exposure step is followed by a heating step to enhance or to speed-up the polymerization and/or crosslinking reaction.

In general, a toplayer or protective overcoat layer over the imageable layer is required to act as an oxygen barrier to provide the desired sensitivity to the plate. A protective overcoat layer typically includes water-soluble or water-swellable polymers such as for example polyvinylalcohol and/or copolymers thereof. Besides acting as barrier for oxygen, the protective overcoat layer should best be easily removable during processing and be sufficiently transparent for actinic radiation, e.g. from 300 to 450 nm or from 450 to 750 nm or from 750 to 1500 nm.

The classical workflow of photopolymer plates involves first an exposure step of the photopolymer printing plate precursor in a violet or infrared platesetter, followed by an optional pre-heat step, a wash step of the protective overcoat layer, an alkaline developing step, and a rinse and gum step. However, there is a clear evolution in the direction of a simplified workflow where the pre-heat step and/or wash step are eliminated and where the processing and gumming step are carried out in one single step or where processing is carried out with a neutral gum and then gummed in a second step. Alternatively, on-press processing wherein the plate is mounted on the press and the coating layer is developed by interaction with the fountain and/or ink that are supplied to the plate during the press run, has become very popular. During the first runs of the press, the non-image areas are removed from the support and thereby define the non-printing areas of the plate. These processing methods are environmentally friendly and highly desired by the customer as "chemistry free processing methods".

In particular printing plates designed for on-press processing, require lithographic coatings that are sufficiently soluble or dispersible on the press so that a good clean-out (complete removal of the coating at non-printing areas of the image) is obtained. Moreover, apart from the clean-out behaviour, also the presslife of such printing plates should be optimized. Both presslife and clean-out performance are determined by the interaction between the coating and the substrate: an optimal presslife requires sufficient adhesion between the substrate and the coating in the image areas, while a good clean-out requires minimal interaction of the coating with the substrate in the non-image areas upon processing. Thus maximizing the clean-out performance may result in reduced image adhesion and consequently in a reduced press life.

Therefore, a compound for improving the adhesion between the photopolymer coating and the support is often added to the printing plate precursor for increasing the resistance of the exposed areas during the processing step and for improving the durability of the plate in the printing process as disclosed in EP 851 299, EP 1 091 251, EP 1 495 866, EP 1 500 498 and EP 1 520 694. Typically, these compounds have an ethylenically unsaturated bond and a functional group capable of adsorbing to the surface of the support and can be present in the photopolymerisble layer or in an intermediate layer between the support and the photopolymerisable layer.

US 2010/0248140 discloses a lithographic printing plate precursor comprising an image-recording layer comprising an infrared absorbing agent, a radical polymerization initiator, a radical polymerizable monomer, a compound having two or more mercapto group-containing groups per molecule and a polymer particle containing a polyalkylene oxide segment.

Although many attempts have been made in the art to provide high performing photopolymer printing plates, there is still a need to improve lithographic properties such as press durability during printing of such printing plates.

SUMMARY OF INVENTION

It is therefore an object of the present invention to provide a negative-working printing plate precursor characterized by both a sufficient clean out behaviour and a high presslife. It is also important that the precursor exhibits an improved shelf-life stability, i.e. an excellent clean-out and no toning when the precursor has been stored under critical conditions such as high temperature and high relative humidity before imaging and processing.

This object is realised by the printing plate precursor defined in claim 1 with preferred embodiments defined in the dependent claims. The printing plate precursor of the present invention has the specific feature that it contains a coating which includes a compound containing at least one thiol group and at least one group capable of adhering to the substrate.

The inventors surprisingly found that the compound containing at least one thiol group and at least one group capable of adhering to the substrate used in the present invention, results in a highly improved clean-out behaviour combined with an excellent resistance of the imaged areas on press. An insufficient clean-out means that, after processing, the non-image areas are not completely removed from the support or that the compounds remaining on the support in the non-image areas are too hydrophobic and, as a result, the hydrophilic property of the surface of the support is reduced. An insufficient clean-out may result in toning on the press, i.e. an undesirable increased tendency of ink-acceptance in the non-image areas of the prints.

The compound containing at least one thiol group and at least one group capable of adhering to the substrate used in the present invention is also referred to herein as "the adhesion promoting compound".

The development is preferably carried out by treating the precursor with a gum solution, however more preferably by mounting the precursor on a plate cylinder of a lithographic printing press and rotating the plate cylinder while feeding dampening liquid and/or ink to the precursor.

It is a further object of the present invention to provide a method for making a lithographic printing plate comprising the steps of:
image-wise exposing the printing plate precursor including the coating as defined above to heat and/or light radiation whereby a lithographic image consisting of image areas and non-image areas is formed and whereby a colour change in the imaged areas is induced;
developing the exposed precursor.

Other features, elements, steps, characteristics and advantages of the present invention will become more apparent from the following detailed description of preferred embodiments of the present invention. Specific embodiments of the invention are also defined in the dependent claims.

DESCRIPTION OF EMBODIMENTS

The Lithographic Printing Plate Precursor

The lithographic printing plate precursor according to the present invention is negative-working, i.e. after exposure and development the non-exposed areas of the coating are removed from the support and define hydrophilic (non-printing) areas, whereas the exposed coating is not removed from the support and defines oleophilic (printing) areas. The hydrophilic areas are defined by the support which has a hydrophilic surface or is provided with a hydrophilic layer. The hydrophobic areas are defined by the coating, hardened upon exposing, optionally followed by a heating step. Areas having hydrophilic properties means areas having a higher affinity for an aqueous solution than for an (oleophilic) ink; areas having hydrophobic properties means areas having a higher affinity for an (oleophilic) ink than for an aqueous solution.

"Hardened" means that the coating becomes insoluble or non-dispersible for the developing solution and may be achieved through polymerization and/or crosslinking of the photosensitive coating, optionally followed by a heating step to enhance or to speed-up the polymerization and/or cross-linking reaction. In this optional heating step, hereinafter also referred to as "pre-heat", the plate precursor is heated, preferably at a temperature of about 80° C. to 150° C. and preferably during a dwell time of about 5 seconds to 1 minute.

The coating contains at least one layer including a photopolymerisable composition, said layer is also referred to as the "photopolymerisable layer". A protective overcoat layer may be provided on top of the photopolymerisable layer. The coating may further include other layers such as for example an intermediate layer, located between the support and the photopolymerisable layer and/or between the optional toplayer and the photopolymerisable layer, an adhesion improving layer, a hydrophilizing layer and/or other layers.

This photopolymerizable layer has a coating thickness preferably ranging between 0.1 and 5.0 $g/m^2$, more preferably between 0.3 and 3.0 $g/m^2$, most preferably between 0.4 and 1.5 $g/m^2$.

The printing plate of the present invention is in characterized that it can be exposed at a low energy density, i.e. below 190 $mJ/m^2$; preferably between 70 and 190 $mJ/m^2$; more preferably between 75 and 150 $mJ/m^2$ and most preferably between 80 and 120 $mJ/m^2$.

Photopolymerisable Layer

The Adhesion Promoting Compound

The adhesion promoting compound includes at least one thiol group. The adhesion promoting compound preferably includes at least two thiol groups, more preferably three or four thiol groups. The thiol group of the adhesion promoting compound may react with the monomers which contain an ethylenically unsaturated double bond present in the coating, such as an acrylate group. Such a reaction is known as a thiol-ene reaction. The adhesion promoting compound further includes at least one group which is capable of adhering to the substrate, preferably at least two groups which are capable of adhering to the substrate. It is believed that the combination of both reactions (i.e. reaction with the monomers which contain an ethylenically unsaturated double bond, and adhering to the substrate) results in a highly improved press life of the printing plate including the adhesion promoting compound.

The group capable of adhering to the substrate is preferably selected from phosphate group or a phosphonate group; most preferably a phosphonate group. The adhesion promotor is a compound having at least 1, preferably at least 2 and most preferably at least 3 phosphate groups and further having at least 1, preferably 2 to 4 thiol groups. In a preferred embodiment, the adhesion promotor includes 2 or 3 thiol groups and 1 or 2 phosphate groups.

The adhesion promoting compound is preferably represented by Formula I:

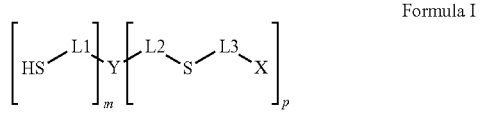

Formula I wherein m and p independently represent 1, 2 or 3;

Y represents a z-valent core having 1 to 12 atoms;

z is the sum of m and p and z is 2, 3, 4 or 5;

X represents a phosphate group or phosphonate group; and

L1, L2 and L3 each independently represent a linking group.

Preferably, the linking groups L1, L2 and L3 each independently represent an optionally substituted straight-chain or branched $C_1$-$C_{12}$-alkanediyl group, more preferably a $C_2$-$C_{12}$-alkanediyl group, most preferably a $C_3$-$C_{12}$-alkanediyl group, preferably interrupted by one or more oxygen atoms and/or one or more carboxyl groups. The optional substituents on the straight-chain or branched alkanediyl group are for example an alkyl group such as a methyl or ethyl group or a hydroxy group and/or combinations thereof.

The linking group L3 preferably includes —(O—$CH_2$-$CH_2$)o- wherein o is an integer greater than 0, preferably an integer between 1 and 30, most preferably an integer between 1 and 15; and the linking group L3 may further include —($CH_2$)$_x$—, —($CH_2$)x—(C=O)—O—($CH_2$)$_y$, —($CH_2$)$_x$—(C=O)—($CH_2$)$_y$—($CH_3$)—($CH_2$)$_x$—(C=O)—, —($CH_2$)$_x$— CH($CH_3$)—(C=O)—, —$CH_2$—$CH_2$—CH($CH_3$)—(C=O)—, —$CH_2CH_2$—$CH_2$—CH($CH_3$)—(C=O)—, —$CH_2$(C=O)—CH—$_2$—$CH_2$—, —$CH_2$—(C=O)—CH($CH_3$)—$CH_2$—, —$CH_2$—C=O)—CH($CH_3$)—$CH_2$—$CH_2$—; and/or combinations thereof wherein x and y are independently an integer greater than 0.

The linking groups L1 and L2 are preferably each independently selected from —$CH_2$—, —$CH_2$—CH2—, —$CH_2$—$CH_2$—O—$CH_2$—$CH_2$—, —$CH_2$—$CH_2$—O—$CH_2$—CH2—O—$CH_2$—$CH_2$—, —$CH_2$—$CH_2$—(C=O)—O—$CH_2$—, —$CH_2$—$CH_2$—(C=O)—O—CH ($CH_3$)—, —$CH_2$—$CH_2$—(C=O)—O—$CH_2$—$CH_2$—, —$CH_2$—$CH_2$—(C=O)—O—$CH_2$—CH($CH_3$)—CH ($CH_3$)—$CH_2$—(C=O)—O—$CH_2$—CH($CH_3$)—$CH_2$— (C=O)—O—$CH_2$—$CH_2$)—, —CH($CH_3$)—$CH_2$— (C=O)—O—$CH_2$—$CH_2$—. —$CH_2$—CH($CH_3$)— (C=O)—O—$CH_2$—CH($CH_3$)—, —$CH_2$—H($CH_3$)— (C=O)—O—$CH_2$—$CH_2$—, —$CH_2$—CH($_3$)—(C=O)— O—$CH_2$—$CH_2$—O—$CH_2$—$CH_2$—, —$CH_2$—CH($CH_3$)— (C=O)—O—$CH_2$—$CH_2$—O—$CH_2$—$CH_2$-O- $CH_2$— $CH_2$— and —$CH_2$—CH($CH_3$)—(C=O)—O—$CH_2$— $CH_2$—O—$CH_2$—$CH_2$—O—$CH_2$—$CH_2$—O—$CH_2$— $CH_2$—.

The z-valent core Y preferably has a small size of no more than 500 g/mol or even less than 300 g/mol and preferably contains no other atoms than C, N, O or H. In a preferred embodiment, the z-valent core Y represents a carbon atom optionally substituted with a methyl or ethyl group, or an isocyanurate group.

The adhesion promoting compound preferably has a molecular weight weight of at least 400 g/mol and not more than 5,000 g/mol and is preferably present in an amount of 1 to 15 wt % based on the total weight of the dry coating. More preferably, the adhesion promoting compound is present in the coating in an amount between 15 and 200 mg/m², more preferably in an amount between 20 and 150 mg/m² and most preferably in an amount between 25 and 75 mg/m².

Particularly preferred adhesion promoting compound are given below:

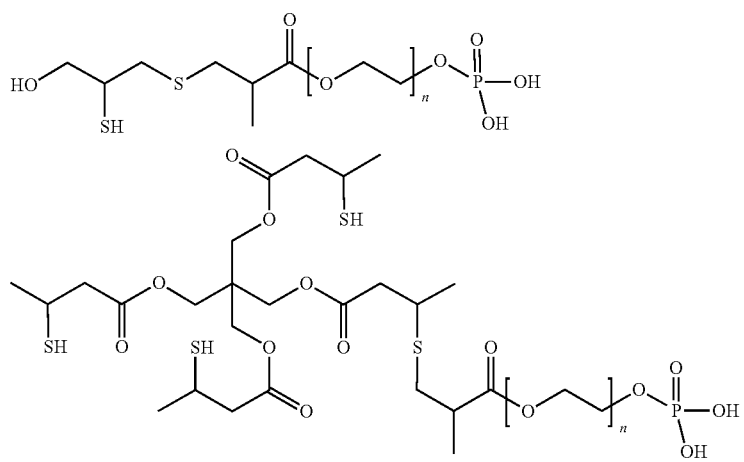

-continued
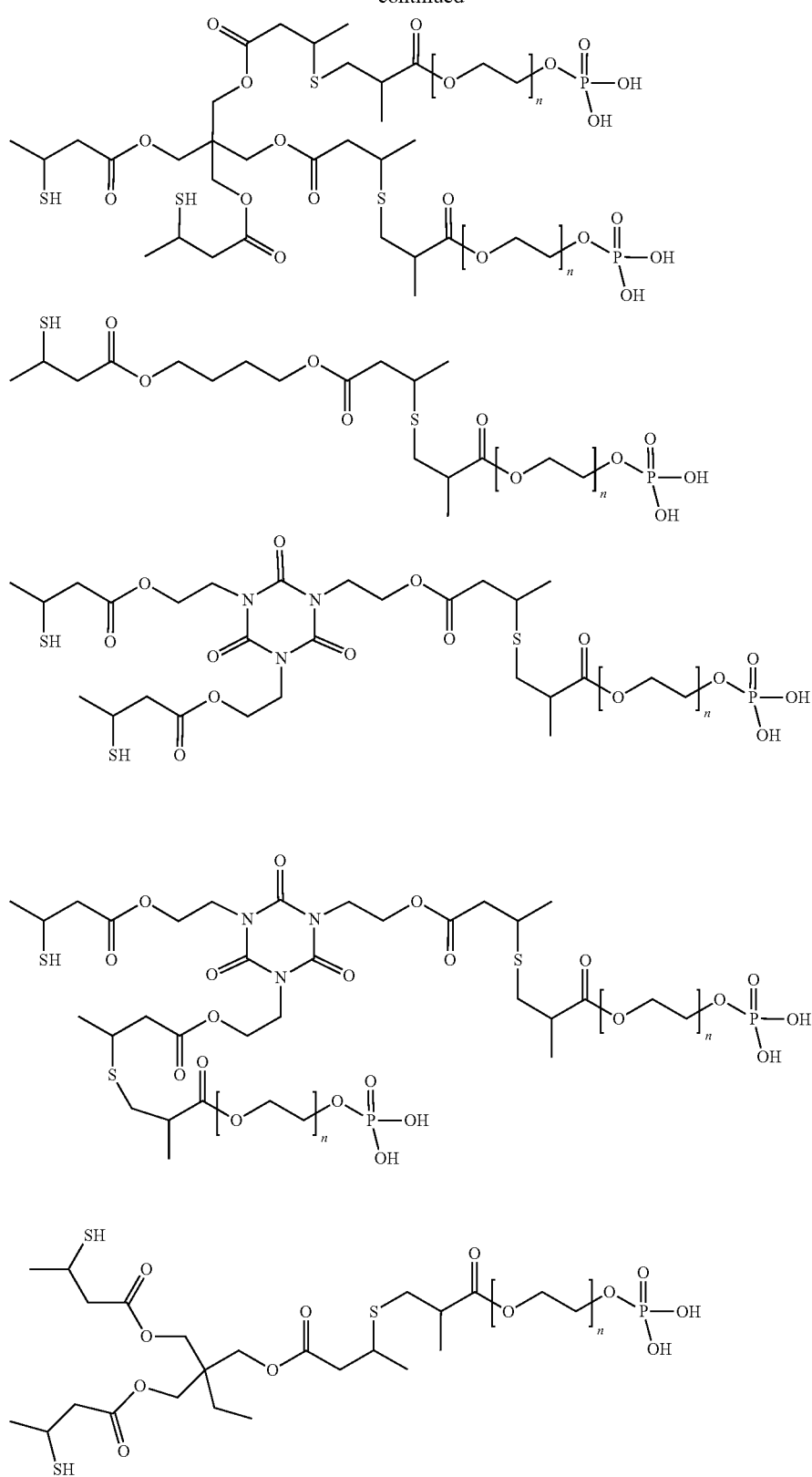

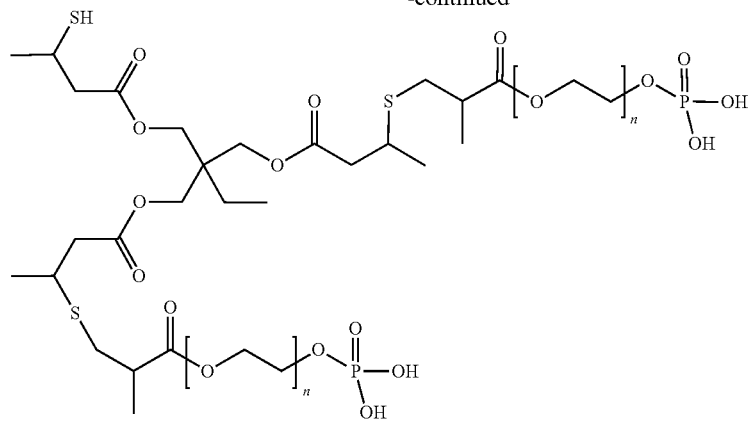

wherein n is an integer greater than 0, preferably an integer between 1 and 30, most preferably an integer between 1 and 15.

The adhesion promoting compound is preferably synthesized using a multifunctional thiol and a polymerizable compound containing a phosphate group, such as e.g. Sipomer™ PAM100 from SOLVAY. Thiol groups can participate in a reaction known as a thiol-ene reaction, which is a reaction between a thiol and an ethylenically unsaturated double bond, such as an acrylate group. Preferred multifunctional thiols contain 2, 3 or 4 thiol groups. The multifunctional thiol is mixed with the polymerizable compound having a phosphate and/or phosphonate group in a molar ratio such that a preferred adhesion promoting compound is obtained having 1 or 2 phosphate groups and 1 to 3 thiol groups.

The synthesis of the adhesion promoting compound preferably proceeds via a radical pathway, in which the radical is formed under a thermal or a light (UV) stimulus. This process can proceed in the absence of a catalyst, or in the presence of a catalyst being a radical generating species. Depending on the stimulus (thermal or light), a different catalyst can be used. The reaction can also proceed via a nucleophilic pathway, in which a base or nucleophile is used as catalyst.

Suitable catalysts for thermal initiation include Al BN, 2,2'-azobis(2-methylbutyronitrile), 1,1'-Azobis(cyclohexanecarbonitrile), tert-amyl peroxybenzoate, 4,4'-Azobis(4-cyanovaleric acid), benzoyl peroxide, 2,2-bis(tert-butylperoxy) butane, 1,1-bis(tert-butylperoxy)cyclohexane, 2,5-bis(tert-butylperoxy)-2,5-dimethylhexane, 2,5-bis(tert-butylperoxy)-2,5-dimethylhexane, 2,5-bis(tert-butylperoxy)-2,5-dimethyl-3-hexyne, Bis(1-(tert-butylperoxy)-1-methylethyl)benzene, 1,1-bis(tert-butylperoxy)-3,3,5-trimethylcyclohexane, tert-butyl hydroperoxide, tert-butyl peracetate, tert-butyl peroxide, tert-butyl peroxybenzoate, tert-butylperoxy isopropyl carbonate, cumene hydroperoxide, cyclohexanone peroxide, dicumyl peroxide, lauroyl peroxide, 2,4-pentanedione peroxide, peracetic acid, and potassium persulfate.

Suitable catalysts for photoinitiation include Norrish Type I and Type II photoinitiators. Type I photoinitiators such as hydroxyacetophenones, alkylaminoacetophenones, benzyl ketals and dialkoxyacetophenones, benzoin ethers, phosphine oxides, BCIM and HABIs, etc. Type II photoinitiators such as optionally substituted benzophenones, thioxanthones, anthraquinones, benzoylformate esters, camphorquinone. Blends of photoinitiators can also be used, as well as polymeric photoinitiators.

Suitable polymerizable compounds containing at least one phosphate and/or phoshonate group are for example:

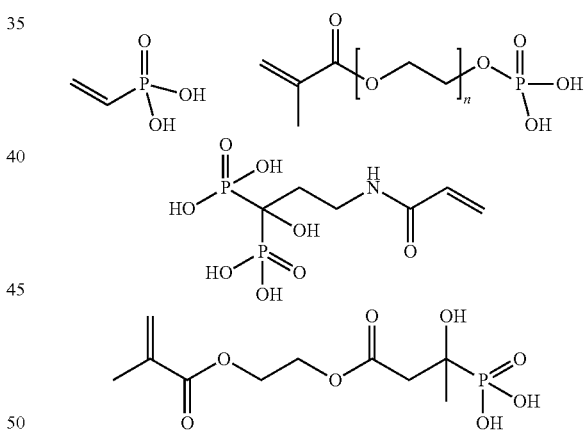

Suitable multifunctional thiols may be selected from the list below:

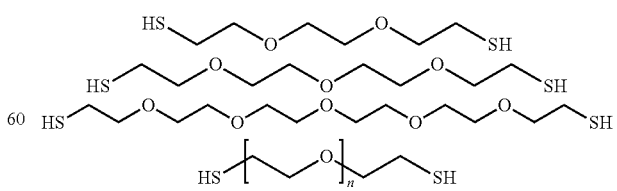

n represents an integer greater than 0, preferably an integer between 1 and 30, most preferably an integer between 1 and 15.

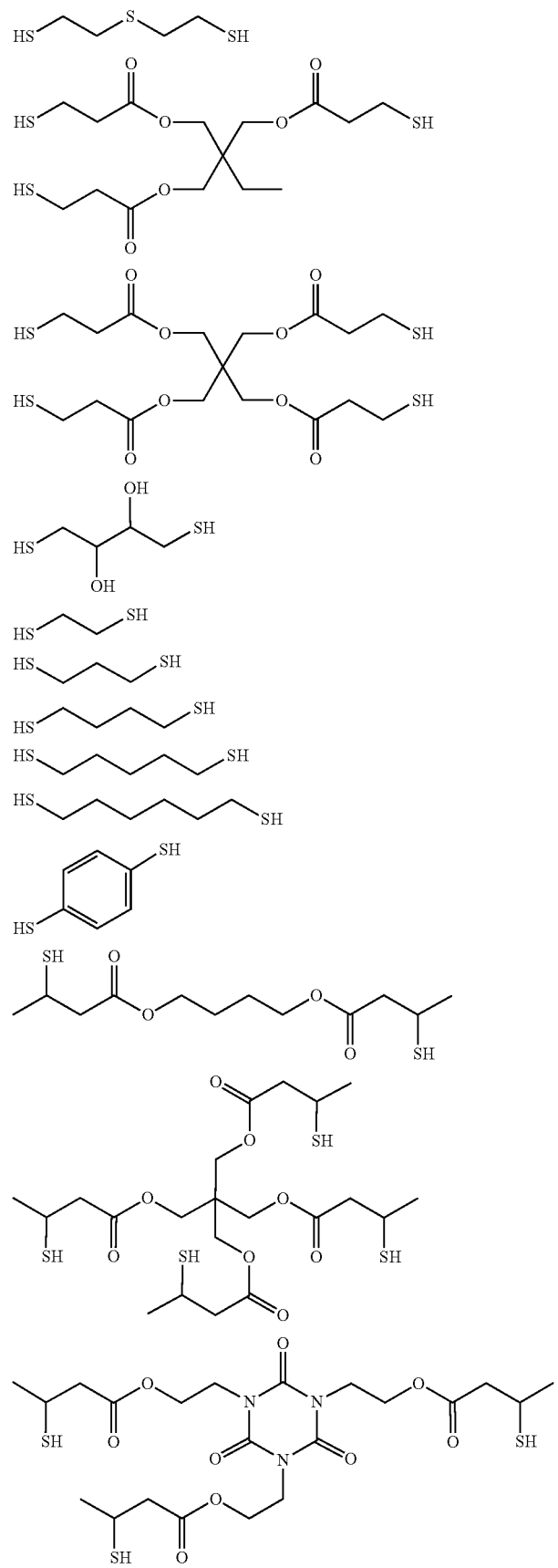

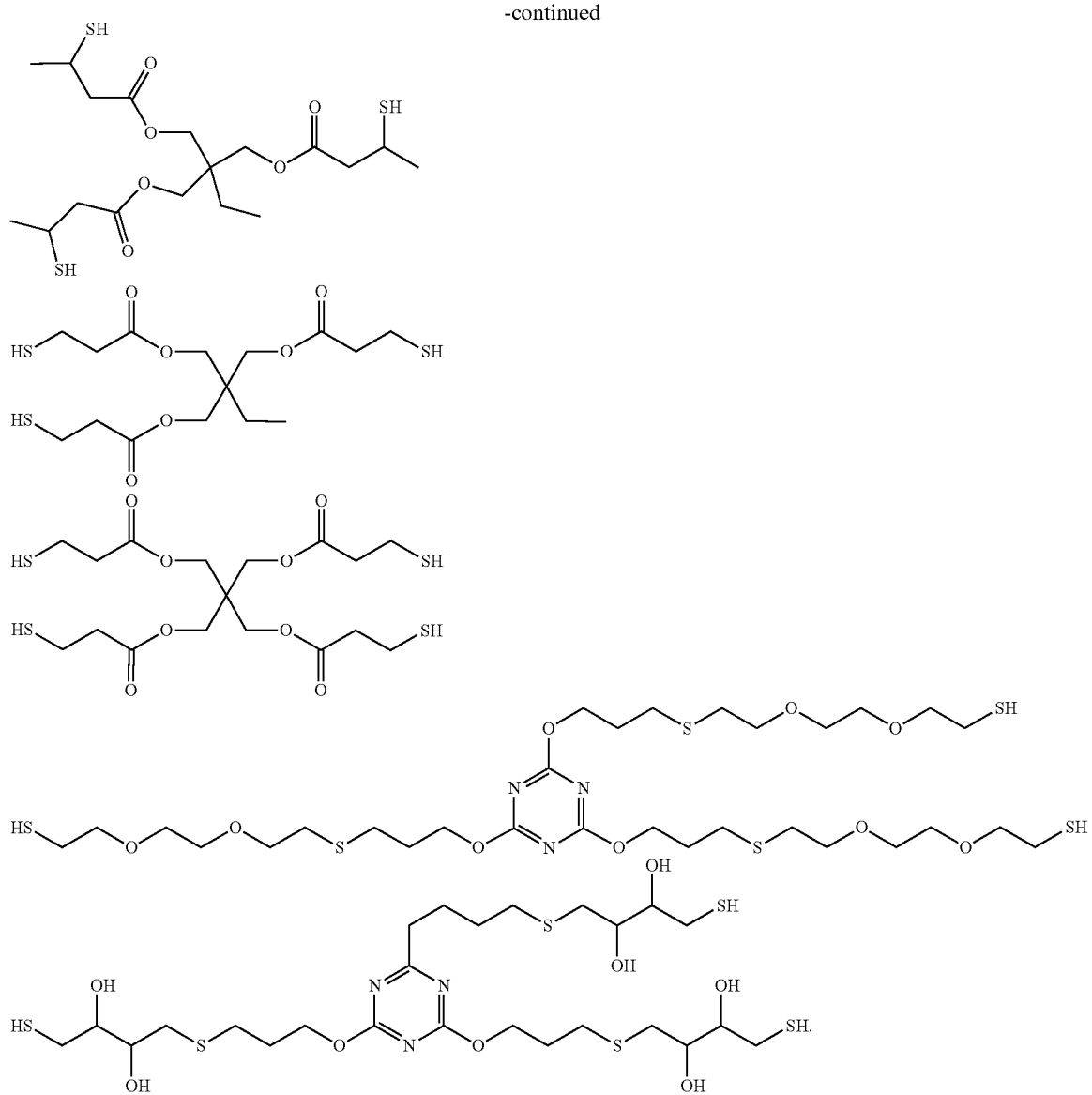
Whithout being limited thereto, specific examples of adhesion promoting compounds according to the present invention are given below:
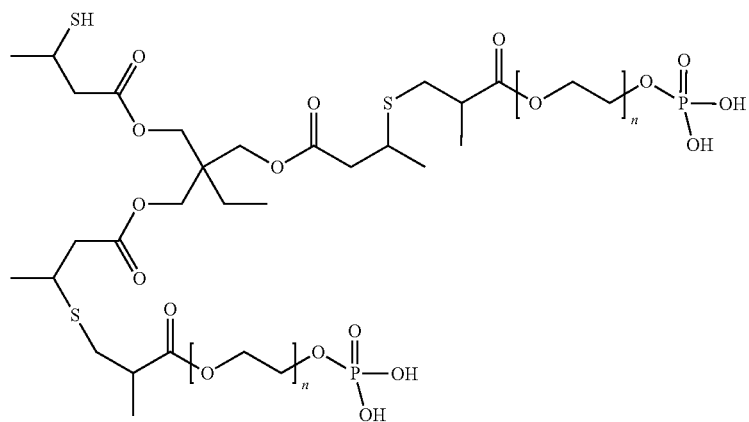

-continued
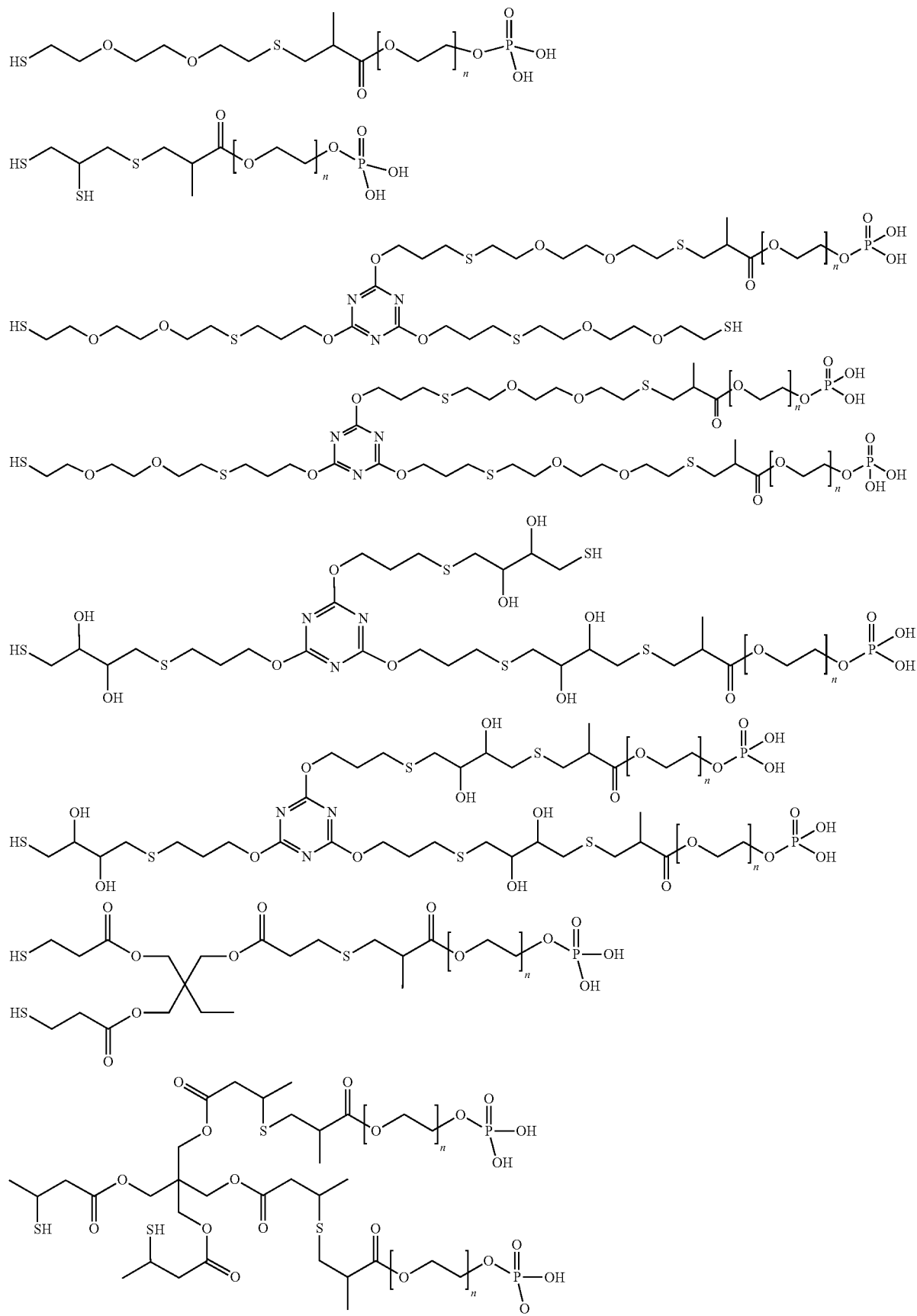

-continued
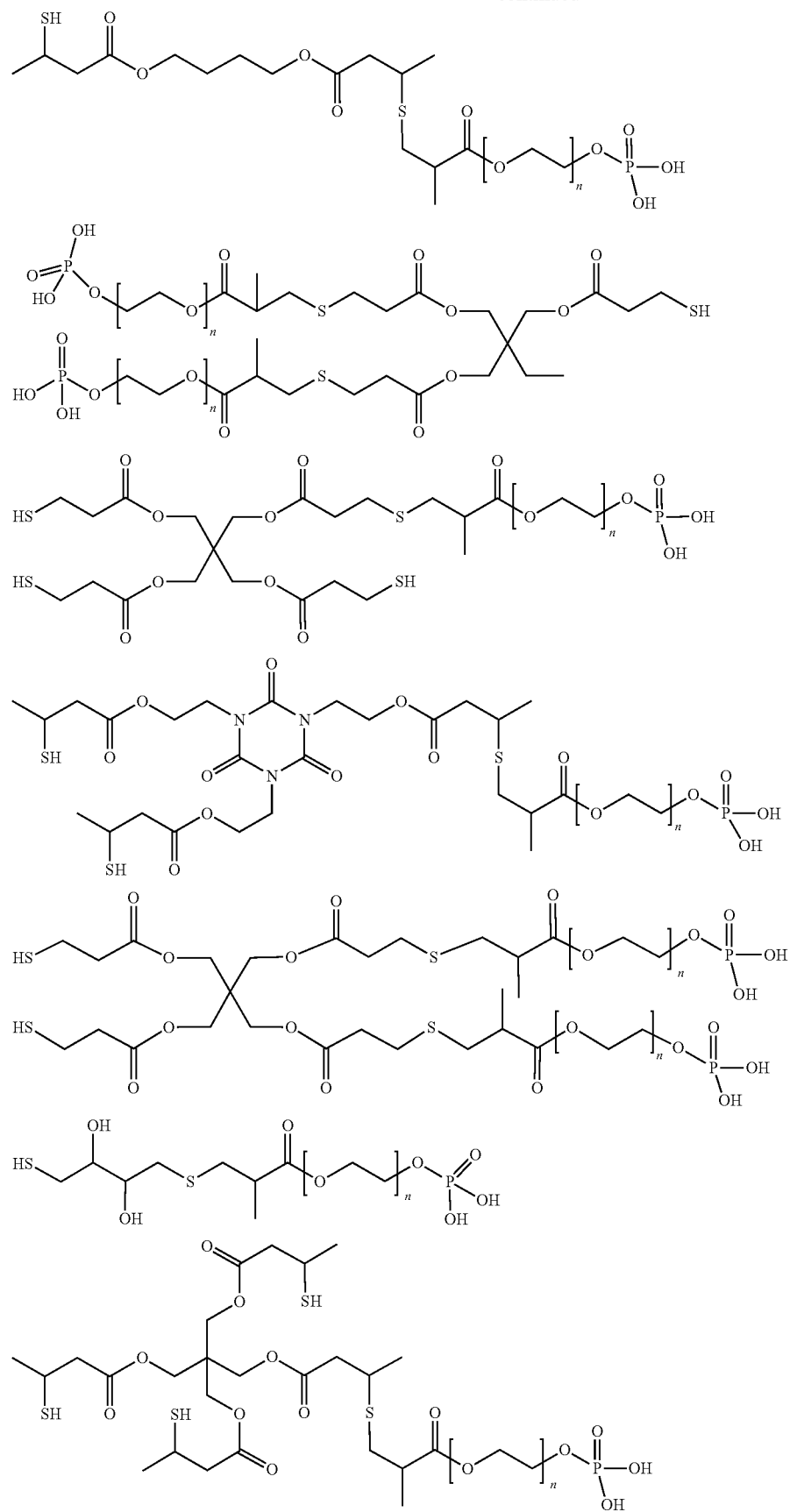

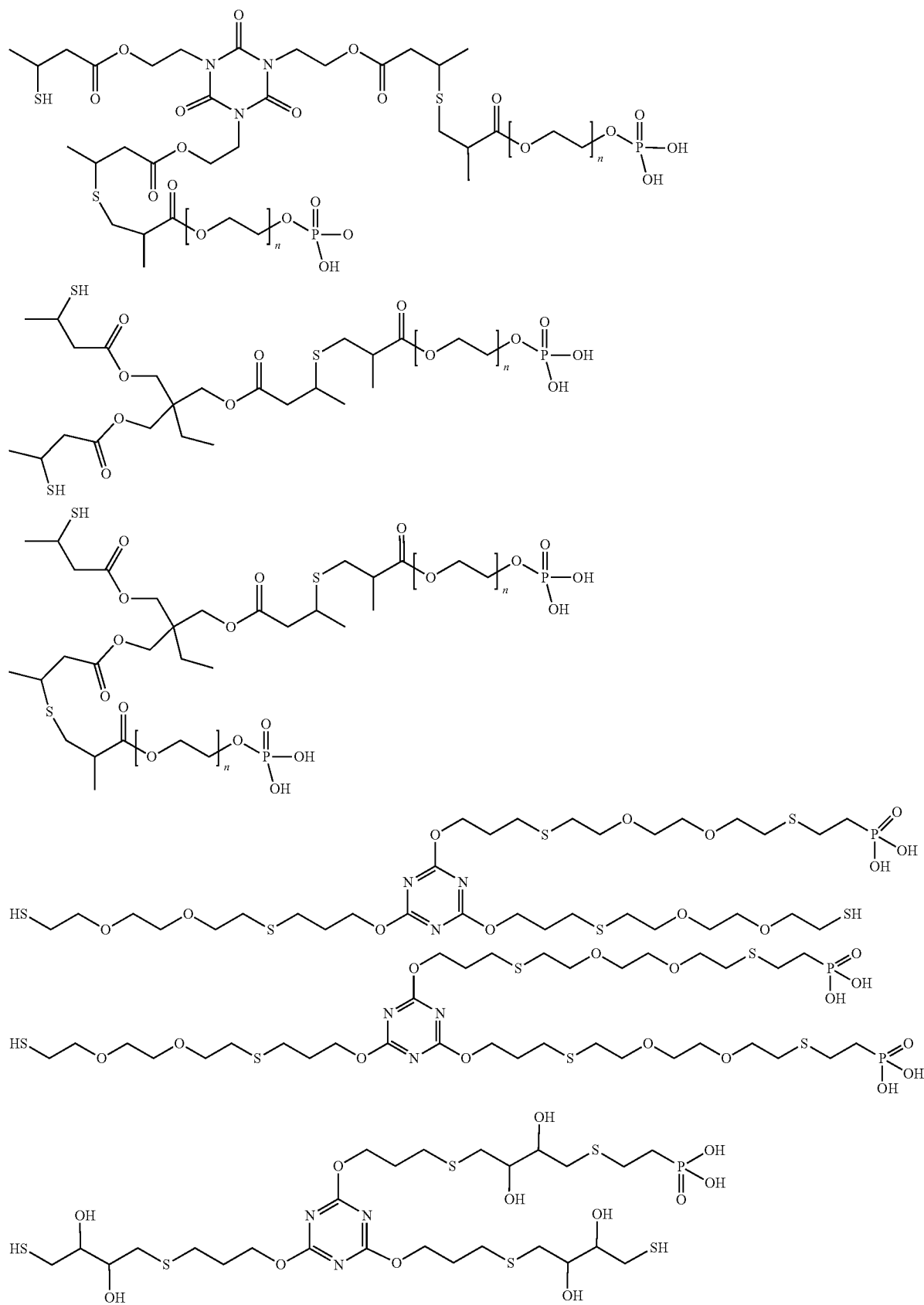

-continued
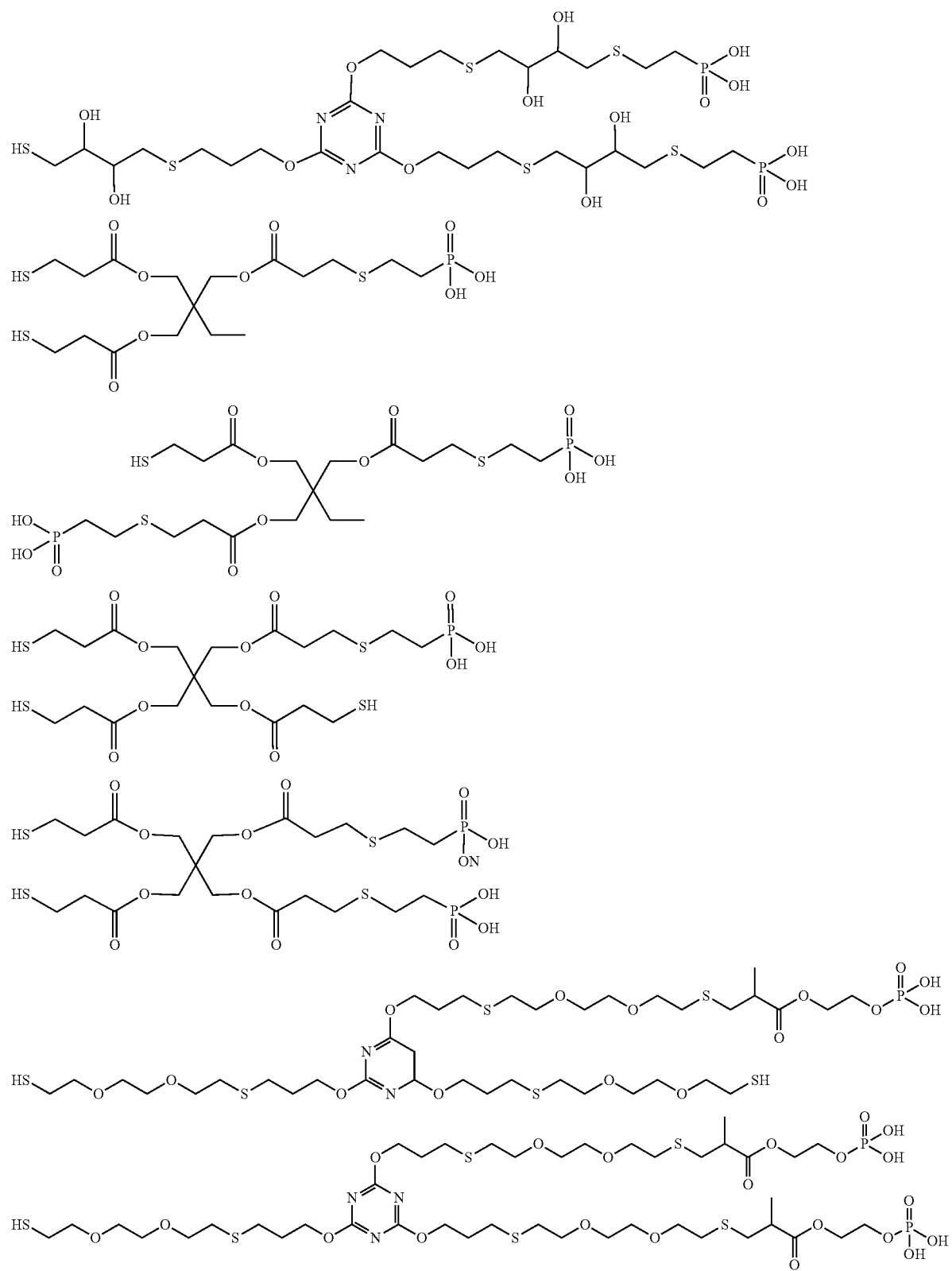

-continued
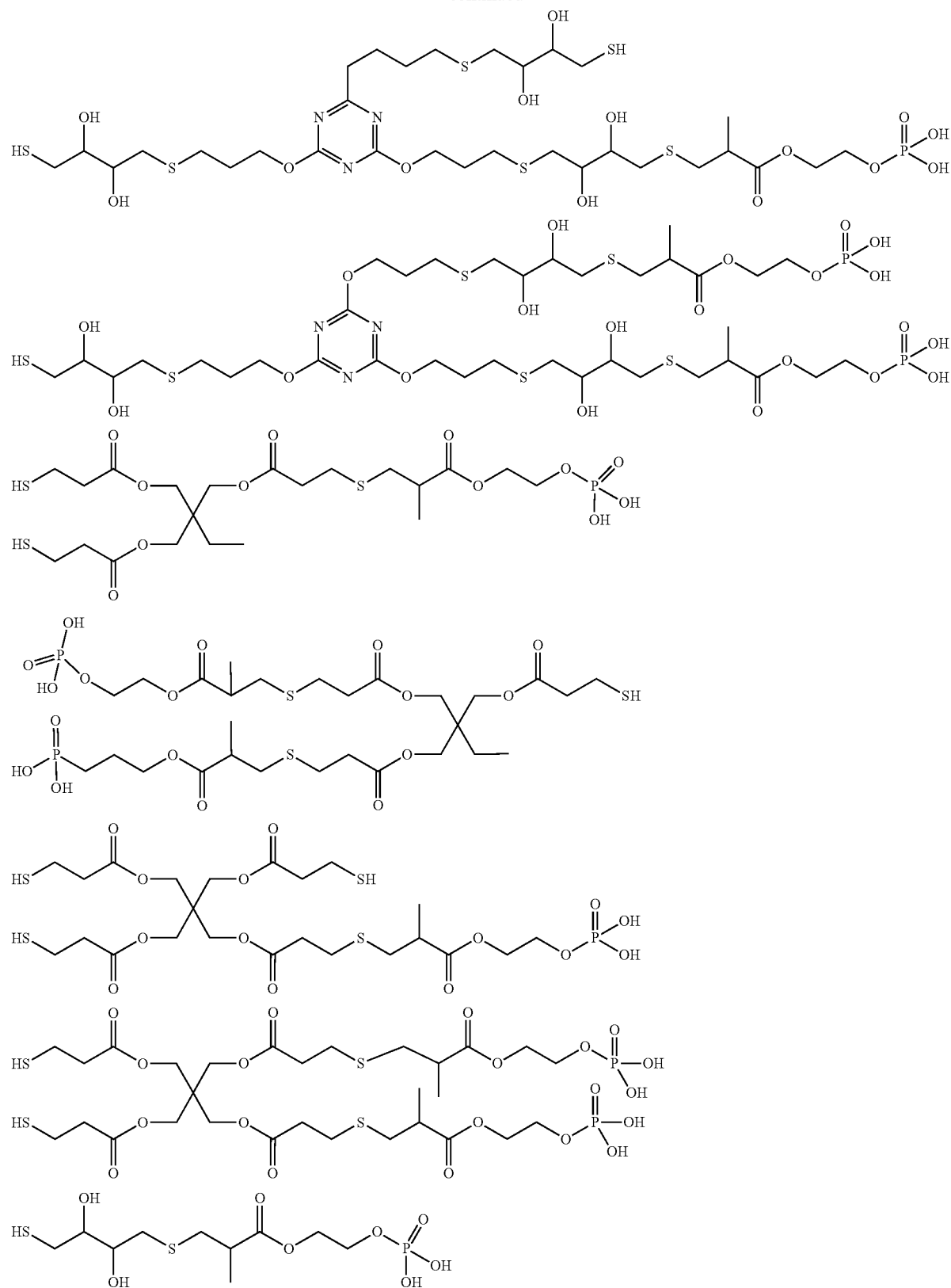

In the above structures n represents an integer greater than 0, preferably an integer between 1 and 30, most preferably an integer between 1 and 15.

Multifunctional thiols can be synthesized via a thiol-ene reaction, using an excess of thiol, as also described in U.S. Pat. No. 8,513,339. A thiol can also be introduced on a molecule through reaction of an amine with a cyclic thiolactone, through reaction of an amine with 2-iminothiolane (Traut's reagent), through nucleophilic ring-opening of an ethylene sulfide, through reaction of a cyclic dithiocarbonate with an amine, etc.

Multifunctional thiols having secondary thiol groups are particularly preferred for reasons of better stability against oxidation.

The adhesion promoting compound according to the present invention may be present in the photopolymerisable layer, and/or in the optional toplayer, and/or in any other optional layer; however the adhesion promoting compound according to the present invention is most preferably present in the photopolymerisable layer.

Photopolymerisable Compound

The photopolymerisable layer includes at least one polymerisable compound, a photoinitiator and optionally a binder. The photopolymerisable layer has a coating thickness preferably ranging between 0.2 and 5.0 g/m$^2$, more preferably between 0.4 and 3.0 g/m$^2$, most preferably between 0.6 and 1.5 g/m$^2$.

According to a preferred embodiment of the present invention, the polymerisable compound is a polymerisable monomer or oligomer including at least one terminal ethylenic unsaturated group, hereinafter also referred to as "free-radical polymerisable monomer". The polymerisation involves the linking together of the free-radical polymerisable monomers. Suitable free-radical polymerisable monomers include, for example, multifunctional (meth)acrylate monomers (such as (meth)acrylate esters of ethylene glycol, trimethylolpropane, pentaerythritol, ethylene glycol, ethoxylated trimethylolpropane, urethane (meth)acrylate) and oligomeric amine di(meth)acrylates. The (meth)acrylic monomers may also have other ethylenically unsaturated groups or epoxide groups in addition to the (meth)acrylate group. The (meth)acrylate monomers may also contain an acidic (such as a carboxylic acid or phosphoric acid) or basic (such as an amine) functionality.

Suitable free-radical polymerisable monomers are disclosed in and of EP 2 916 171 and are incorporated herein by reference.

The Initiator

Any free radical initiator capable of generating free radicals upon exposure directly or in the presence of a sensitizer, is according to this invention a suitable initiator, also referred to herein as photoinitiator. Suitable examples of photoinitiators include onium salts, carbon-halogen bond-containing compounds such as [1,3,5] triazines having trihalomethyl groups, organic peroxides, aromatic ketones, thio compounds, azo based polymerization initiators, azide compounds, ketooxime esters, hexaarylbisimidazoles, metallocenes, active ester compounds, borates and quinonediazides. Of these, onium salts, especially iodonium and/or sulfonium salts are preferable in view of storage stability.

More specific suitable free-radical initiators include, for example, the derivatives of acetophenone (such as 2,2-dimethoxy-2-phenylacetophenone, and 2-methyl-l-[4-(methylthio) phenyll-2-morpholino propan-l-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyloxy)-phenyl) phenyliodonium hexafluoroantimonate, triarylsulfonium hexafluorophosphate, triarylsulfonium p-toluenesulfonate, (3-phenylpropan-2-onyl) friaryl phosphonium hexafluoroantimonate, and N-ethoxy(2-methyl) pyridinium hexafluorophosphate, and onium salts as described in U.S. Pat. Nos. 5,955,238, 6,037,098, and 5,629,354);

borate salts (such as tetrabutylammonium triphenyl(n-butyl) borate, tetraethylammonium triphenyl(n-butyl)borate; diphenyliodonium tetraphenylborate, (4-tert-butyl-phenyl)-(4-methoxy-phenyl) iodonium tetraphenylborate, phenyl-(4-tert-butyl-phenyl) iodonium tetraphenylborate, phenyl-(4-cumyl-phenyl) iodonium tetraphenylborate, phenyl-(3-cumyl-phenyl) iodonium tetraphenylborate and/or mixtures thereof;

diphenyliodonium tetraphenylborate wherein the phenyl groups of the iodonium salt are substituted with a group including at least six carbon atoms, and triphenylsulfonium triphenyl(n-butyl)borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-l-yl)-s-triazine, 2,4-bis(trichloromethyl)-6-piperonyl-s-triazine, and 2,4-bis(trichloromethyl)-6-[(4-ethoxy-ethylenoxy)-phen-1-yl]s-triazine, and s-triazines as described in U.S. Pat. Nos. 5,955,238, 6,037,098, 6,010,824 and 5,629,354); and titanocene (bis(etha.9-2,4-cyclopentadien-1-yl) bis[2,6-difluoro-3-(I1-1-pyrrol-1-yl)phenyl) titanium). Onium salts, borate salts, and s-triazines are preferred free radical initiators. Diaryliodonium salts and triarylsulfonium salts are preferred onium salts. Triarylalkylborate salts are preferred borate salts. Trichloromethyl substituted s-triazines are preferred s-triazines. These initiators may have optional substituents and may be used alone or in combination.

Optionally substituted trihaloalkyl sulfones wherein halo independently represents bromo, chloro or iodo and sulfone is a chemical compound containing a sulfonyl functional group attached to two carbon atoms, are particularly preferred initiators. Tribromomethyl phenyl sulfones are most preferred initiators. More details concerning this initiator can be found in patent application WO2019/179995 paragraphs [0029] to [0040].

The amount of the initiator typically ranges from 0.05 to 30% by weight, preferably from 0.1 to 15% by weight, most preferably from 0.2 to 10% by weight relative to the total dry weight of the components in the photopolymerisable composition.

The photopolymerisable layer may also comprise a co-initiator. Typically, a co-initiator is used in combination with a free radical initiator. Suitable co-initiators for use in the photopolymer coating are disclosed in U.S. Pat. No. 6,410,205; U.S. Pat. No. 5,049,479; EP 1 079 276, EP 1 369 232, EP 1 369 231, EP 1 341 040, US 2003/0124460, EP 1 241 002, EP 1 288 720 and in the reference book including the cited refences: Chemistry & Technology UV & EB formulation for coatings, inks & paints—Volume 3—Photoinitiators for Free Radical and Cationic Polymerisation by K. K. Dietliker—Edited by P. K. T. Oldring—1991—ISBN 0 947798161. Specific co-initiators, as described in EP 107 792, may be present in the photopolymerizable layer to further increase the sensitivity. Preferred co-initiators are disclosed in EP 2 916 171 and are incorporated herein by reference.

A very high sensitivity can be obtained by including an optical brightener as sensitizer in the coating. Suitable examples of optical brighteners as sensitizers are described in WO 2005/109103 page 24, line 20 to page 39. Useful sensitizers can be selected from the sensitizing dyes disclosed in U.S. Pat. No. 6,410,205; U.S. Pat. No. 5,049,479; EP 1 079 276, EP 1 369 232, EP 1 369 231, EP 1 341 040, US 2003/124460, EP 1 241 002 and EP 1 288 720.

Specific co-initiators, as described in EP 107 792, may be present in the photopolymerizable layer to further increase the sensitivity. Preferred co-initiators are sulfur-compounds, especially thiols like e.g. 2-mercaptobenzothiazole, 2-mercaptobenzoxazole, 2-mercapto-benzimidazole, 4-methyl-3-propyl-1,2,4-triazoline-5-thione, 4-methyl-3-n-heptyl-1,2,4-triazoline-5-thione, 4-phenyl-3-n-heptyl-1,2,4-triazoline-5-thione, 4-phenyl-3,5-dimercapto-1,2,4-triazole, 4-n-decyl-3,5-dimercapto-1,2,4-triazole, 5-phenyl-2-mercapto-1,3,4-oxadiazole, 5-methylthio-1,3,4-thiadiazoline-2-thione, 5-hexylthio-1,3,4-thiadiazoline-2-thione, mercaptophenyltetrazole, pentaerythritol mercaptopropionate, butyric acid-3-mercapto-neopentanetetrayl ester, pentaerythritol tetra(thioglycolate). Other preferred co-initiators are polythioles as disclosed in WO 2006/048443 and WO 2006/048445. These polythiols may be used in combination with the above described thiols, e.g. 2-mercaptobenzothiazole.

The Binder

The photopolymerizable layer preferably includes a binder. The binder can be selected from a wide series of organic polymers. Compositions of different binders can also be used. Useful binders are described in for example EP 1 043 627 in paragraph [0013], WO2005/111727 page 17 line 21 to page 19 line 30 and in WO2005/029187 page 16 line 26 to page 18 line 11.

The photopolymerizable layer may include discrete particles, i.e. particulate shaped polymers including homopolymers or copolymers prepared from monomers such as ethylene, styrene, vinyl chloride, methyl acrylate, ethyl acrylate, methyl methacrylate, ethyl methacrylate, acrylonitrile, vinyl carbazole, acrylate or methacrylate, or mixtures thereof. Preferably the discrete particles are particles which are suspended in the polymerisable composition. The presence of discrete particles tends to promote developability of the unexposed areas.

Thermally reactive polymer fine particles including a thermally reactive group such as an ethylenically unsaturated group, a cationic polymerizable group, an isocyanate group, an epoxy group, a vinyloxy group, and a functional group having an active hydrogen atom, a carboxy group, a hydroxy group, an amino group or an acid anhydride.

The average particle diameter of the polymer fine particle is preferably 0.01 mm to 3.0 mm. Particulate polymers in the form of microcapsules, microgels or reactive microgels are suitable as disclosed in EP 1 132 200; EP 1 724 112 and US 2004/106060.

Specific examples of binders are described in U.S. Pat. No. 6,899,994; US 2004/0260050, US 2005/0003285, US 2005/0170286, US 2005/0123853 and EP 2 916 171 in [0029], and [0031]. Other suitable binders as described in EP 2 471 655, EP 2 492 748 and EP 2 660 068 include multifunctional thiols having 6 to 10 functional groups as a nucleus (central skeleton) and polymer chains connected to the nucleus through sulfide bonds. In addition, the imageable layer may optionally comprise one or more co-binders. Typical co-binders are water-soluble or water-dispersible polymers, such as, cellulose derivatives, polyvinylalcohol, polyacrylic acid poly(meth)acrylic acid, polyvinylpyrrolidone, polylactide, polyvinylphosphonic acid, synthetic co-polymers, such as co-polymers of an alkoxy polyethylene glycol (meth)acrylate. Specific examples of co-binders are described in US 2004/0260050, US 2005/0003285 and US 2005/0123853.

Other Ingredients

The photopolymerisable layer may also comprise particles which increase the resistance of the coating against manual or mechanical damage. The particles may be inorganic particles, organic particles or fillers such as described in for example U.S. Pat. No. 7,108,956. More details of suitable spacer particles described in EP 2 916 171 to are incorporated herein by reference.

The photopolymerizable layer may also comprise an inhibitor. Particular inhibitors for use in the photopolymer coating are disclosed in U.S. Pat. No. 6,410,205, EP 1 288 720 and EP 1 749 240.

The photopolymerizable layer may include a leuco dye which forms a coloured compound upon exposure to light and/or heat, preferably infrared light, whereby a print-out image is formed. More information with regards to suitable leuco dyes can be found in unpublished application EP19153178 to [0085].

The photopolymerisable layer may further include at least one borate compound. The borate compound preferably refers to a chemical compound including a borate anion and preferably a cation as counterion. The borate anion may originate from the counterion of the photoinitiator; e.g. a diphenyliodonium photoinitiator and/or the counterion of the infrared absorbing compound described above or any other salt e.g. sodium tetraphenylborate.

Preferably, the borate anion is a tetrahedral boron anion and may be represented by the following Formula A:

Formula A wherein $R_b^1$, $R_b^2$, $R_b^3$ and $R_b^4$ are independently an optionally substituted aliphatic hydrocarbon group, an optionally substituted aryl or heteroaryl group; alternatively, two or more of $R_b^1$, $R_b^2$, $R_b^3$ and $R_b^4$ can be joined together to form a heterocyclic ring with the boron atom, such a ring may include up to seven carbon, nitrogen, oxygen and/or nitrogen atoms. Preferably, $R_b^1$, $R_b^2$, $R_b^3$ and $R_b^4$ are independently an optionally substituted aryl or heteroaryl group. More preferably, $R_b^1$, $R_b^2$, $R_b^3$ and $R_b^4$ are independently an optionally substituted aryl group. Most preferably, the borate compound includes at least one optionally substituted phenyl group, more preferably at least two optionally substituted phenyl groups, even more preferably at least three optionally substituted phenyl groups and most preferably four optionally substituted phenyl groups.

$M^+$ is an alkali metal cation such as e.g. $Li^+$, $Na^+$, $K^+$ or an optional substituted onium ion. Examples of the optionally substituted onium ion include pyridinium, ammonium, iodonium or sulfonium.

Examples of a pyridinium ion include N-alkyl-3-pyridinium group, an N-benzyl-3-pyridinium group, an N-(alkoxy polyalkyleneoxy alkyl)-3-pyridinium group, an N-alkoxycarbonylmethyl-3-pyridinium group, an N-alkyl-4pyridinium group, an N-benzyl-4-pyridinium group, an N-(alkoxy polyalkyleneoxy alkyl)-4-pyridinium group, an N-alkoxycarbonylmethyl-4-pyridinium group, N-alkyl-3,5-dimethyl-4-pyridinium, N-alkyl-3-pyridinium group or N-alkyl-4-pyridinium group, an N-methyl-3-pyridinium, an N-octyl-3pyridinium, an N-methyl-4-pyridinium, or an N-octyl-4-pyridinium is particularly preferred, and an Noctyl-3-pyridinium group or an N-octyl-4-pyridinium group is most preferred.

The optional substituted onium ion is preferably an ammonium ion represented by Formula B:

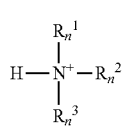

Formula B wherein
$R_n^1$, $R_n^2$ and $R_n^3$ are independently an optionally substituted aliphatic hydrocarbon group, an optionally substituted aryl or heteroaryl group or a halogen atom.

The optional substituted onium ion is most preferably a iodonium ion; more preferably an optionally substituted dipenyl iodonium salt. Diphenyl iodonium salts substituted with electron-donating groups, for example, alkyl groups or alkoxyl groups, and asymmetric diphenyl iodonium salts are particularly preferred. The phenyl groups of the iodonium ion are preferably substituted with a group including at least six carbon atoms.

Specific examples of borate compounds including a iodonium ion include 4-hexyloxyphenyl-2,4-diethoxyphenyl iodonium tetrafluoroborate, 4-octyloxyphenyl phenyliodonium tetraphenylborate, [4-[(2-hydroxytetradecyl)-oxy]phenyl]phenyliodonium tetraphenylborate, bis(4-t-butylphenyl) iodonium tetraphenylborate, 4-methylphenyl-4'-hexylphenyliodonium tetraphenylborate-4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-5 methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis(pentafluorophenyl) borate, 4-methylphenyl-4' -dodecylphenyliodonium tetrakis(4-fluorophenyl)borate, bis(dodecylphenyl)iodonium tetrakis(pentatluorophenyl)borate, and bis(4-t-butylphenyl)iodonium tetrakis(limidazolyl) borate. Preferred compounds include bis(4-t-butylphenyl) iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate.

The borate compound may be present in an amount comprised between 0.05 and 30% by weight, more preferably between 0.1 and 25% by weight, and most preferably from 0.5 and 15% by weight relative to the components of the photopolymerisable layer.

Various surfactants may be added into the photopolymerisable layer to allow or enhance the developability of the precursor; especially developing with a gum solution. Both polymeric and small molecule surfactants for example non-ionic surfactants are preferred. More details are described in EP 2 916 171 and are incorporated herein by reference.

Toplayer

The coating may include a toplayer or protective overcoat layer which may act as an oxygen barrier layer. Low molecular weight substances present in the air may deteriorate or even inhibit image formation and therefore a toplayer is applied to the coating. A toplayer should preferably be easily removable during development, adhere sufficiently to the photopolymerisable layer or optional other layers of the coating and should preferably not inhibit the transmission of light during exposure. The toplayer is preferably provided on top of the photopolymerisable layer.

The optional toplayer may further include a binder. Preferred binders which can be used in the toplayer are polyvinyl alcohol.The polyvinylalcohol has preferably a hydrolysis degree ranging between 74 mol % and 99 mol %, more preferably between 80-98%. The weight average molecular weight of the polyvinylalcohol can be measured by the viscosity of an aqueous solution, 4% by weight, at 20° C. as defined in DIN 53 015, and this viscosity number ranges preferably between 2 and 26, more preferably between 2 and 15, most preferably between 2 and 10.

The optional toplayer may include a halogenated polymer which is preferably a hydrophobic polymer, i.e. not soluble or swellable in water at about neutral pH. This binder may be used in the toplayer in the form of a dispersion; i.e. an emulsion or suspension. The amount of the halogenated binder in the toplayer may be between 30% wt and 96% wt, more preferably between 40% wt and 90% wt and most preferably between 50% wt and 85% wt. The halogenated binder preferably includes between 60% wt and 95% wt monomeric units derived from vinylidene monomers such as vinylidene fluoride, vinylidene chloride, vinylidene bromide and/or vinylidene iodide.

The optional toplayer may optionally include other ingredients such as inorganic or organic acids, matting agents, surfactants such as anionic surfactants, e.g. sodium alkyl sulphate or sodium alkyl sulphonate; amphoteric surfactants, e.g. alkylaminocarboxylate and alkylamino-dicarboxylate; non-ionic surfactants, e.g. polyoxyethylene alkyl phenyl ether, (co)polymers comprising siloxane and/or perfluoroalkyl units and/or oligo(alkylene oxide) units; fillers, (organic) waxes, alkoxylated alkylene diamines as for example disclosed in EP 1 085 380 (paragraph [0021] and) [0022]), glycerine, inorganic particles, pigments or wetting agents as disclosed in EP 2 916 171 and are incorporated herein by reference. The optional toplayer may further include an infrared absorbing compound which is capable of forming a coloured compound—whereby a print-out image is formed—upon exposure to infrared light and/or heat. More information with regards to such infrared absorbing dyes are retrievable in unpublished application EP 20181812 to [0072].

The coating thickness of the optional toplayer may be between 0.10 and 1.75 g/m², more preferably between 0.20 and 1.30 g/m²,more preferably between 0.25 and 1.0 g/m² and most preferably between 0.30 and 0.80 g/m². Preferably, the optional toplayer has a coating thickness between and 1.75 g/m² and comprises a polyvinylalcohol having a hydrolysis degree ranging between 74 mol % and 99 mol % and a viscosity number as defined above ranging between 2 and 26 mPas.

The hydrophilic polymers in the protective overcoat layer may result in a problematic viscosity increase of press chemicals such as for example fountain solution and/or developer solution. Therefore, the coat weight of the hydrophilic polymers and/or thickness of the protective overcoat layer should preferably not be too high; e.g. above the ranges given above.

Definitions

An aliphatic hydrocarbon group preferably represents an alkyl, cycloalkyl, alkenyl, cyclo alkenyl or alkynyl group; suitable groups thereof are described below. An aromatic hydrocarbon group preferably represents a hetero(aryl) group; suitable hetero(aryl) groups—i.e. suitable aryl or heteroaryl groups—are described below.

The term "alkyl" herein means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl, etc. Examples of suitable alkyl groups are methyl, ethyl, n-propyl, isopropyl, n-butyl, 1-isobutyl, 2-isobutyl and tertiary-butyl, n-pentyl, n-hexyl, chloromethyl, trichloromethyl, iso-propyl, iso-butyl, iso-pentyl, neo-pentyl, 1-methylbutyl and iso-hexyl, 1,1-dimethylpropyl, 2,2-dimethylpropyl and 2-methyl-butyl, cyclopropyl, cyclobutyl, cyclopentyl, cyclohexyl and methylcyclohexyl groups. Preferably, the alkyl group is a $C_1$ to $C_6$-alkyl group.

A suitable alkenyl group is preferably a $C_2$ to $C_6$-alkenyl group such as an ethenyl, n-propenyl, n-butenyl, n-pentenyl, n-hexenyl, iso-propenyl, iso-butenyl, iso-pentenyl, neo-pentenyl, 1-methylbutenyl, iso-hexenyl, cyclopentenyl, cyclohexenyl and methylcyclohexenyl group.

A suitable alkynyl group is preferably a $C_2$ to $C_6$-alkynyl group; a suitable aralkyl group is preferably a phenyl group or naphthyl group including one, two, three or more $C_1$ to $C_6$-alkyl groups; a suitable alkaryl group is preferably a $C_1$ to $C_6$-alkyl group including an aryl group, preferably a phenyl group or naphthyl group.

A cyclic group or cyclic structure includes at least one ring structure and may be a monocyclic- or polycyclic group, meaning one or more rings fused together.

Examples of suitable aryl groups may be represented by for example an optionally substituted phenyl, benzyl, tolyl or an ortho- meta- or para-xylyl group, an optionally substituted naphtyl, anthracenyl, phenanthrenyl, and/or combinations thereof. The heteroaryl group is preferably a monocyclic or polycyclic aromatic ring comprising carbon atoms and one or more heteroatoms in the ring structure, preferably, 1 to 4 heteroatoms, independently selected from nitrogen, oxygen, selenium and sulphur. Preferred examples thereof include an optionally substituted fury!, pyridinyl, pyrimidyl, pyrazoyl, imidazoyl, oxazoyl, isoxazoyl, thienyl, tetrazoyl, thiazoyl, (1,2,3)triazoyl, (1,2,4)triazoyl, thiadiazoyl, thiofenyl group and/or combinations thereof.

A cyclic group or cyclic structure includes at least one ring structure and may be a monocyclic- or polycyclic group, meaning one or more rings fused together.

Halogens are selected from fluorine, chlorine, bromine or iodine.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

The optional substituents on the alkyl, cycloalkyl, alkenyl, cycloalkenyl, alkynyl, aralkyl, alkaryl, aryl and heteroaryl group are preferably selected from hydroxy, —Cl, —Br, —I, —OH, —SH, —CN, —NO$_2$, an alkyl group such as a methyl or ethyl group, an alkoxy group such as a methoxy or an ethoxy group, an aryloxy group, a carboxylic acid group or an alkyl ester thereof, a sulphonic acid group or an alkyl ester thereof, a phosphonic acid group or an alkyl ester thereof, a phosphoric acid group or an an ester such as an alkyl ester such as methyl ester or ethyl ester, a thioalkyl group, a thioaryl group, thioheteroaryl, —SH, a thioether such as a thioalkyl or thioaryl, ketone, aldehyde, sulfoxide, sulfone, sulfonate ester, sulphonamide, an amino, ethenyl, alkenyl, alkynyl, cycloalkyl, alkaryl, aralkyl, aryl, heteroaryl or heteroalicyclic group and/or combinations thereof.

The term leuco dye refers to compounds which can change from essentially colourless or pale-coloured to coloured, or vice versa, when irradiated with UV light, IR light and/or heated.

Support

The lithographic printing plate used in the present invention comprises a support, also referred to herein as substrate, which has a hydrophilic surface or which is provided with a hydrophilic layer. The support is preferably a grained and anodized aluminium support, well known in the art. Suitable supports are for example disclosed in EP 1 843 203 (paragraphs [0066] to [0075]). The surface roughness, obtained after the graining step, is often expressed as arithmetical mean center-line roughness Ra (ISO 4287/1 or DIN 4762) and may vary between 0.05 and 1.5 µm. The aluminum substrate of the current invention has preferably an Ra value between 0.1 and 1.4 µm, more preferably between 0.3 and 1.0 µm and most preferably between 0.4 and 0.9 µm. The lower limit of the Ra value is preferably about 0.1 µm. More details concerning the preferred Ra values of the surface of the grained and anodized aluminum support are described in EP 1 356 926. By anodising the aluminum support, an Al$_2$O$_3$ layer is formed and the anodic weight (g/m$^2$ Al$_2$O$_3$ formed on the aluminum surface) varies between 1 and 8 g/m$^2$. The anodic weight is preferably ≥2.0 g/m$^2$, more preferably ≥2.5 g/m$^2$ and most preferably ≥3.0 g/m$^2$ The grained and anodized aluminium support may be subjected to so-called post-anodic treatments, for example a treatment with polyvinylphosphonic acid or derivatives thereof, a treatment with polyacrylic acid or derivatives thereof, a treatment with potassium fluorozirconate or a phosphate, a treatment with an alkali metal silicate, or combinations thereof. Treatment of the edges of the support as described in for example US 2017/320351 may be of interest to prevent occurrence of printing edges. Alternatively, the support may be treated with an adhesion promoting compound such as those described in EP 1 788 434 in and in WO 2013/182328. However, for a precursor optimized to be used without a pre-heat step it is preferred to use a grained and anodized aluminium support without any post-anodic treatment.

Besides an aluminium support, a plastic support, for example a polyester support, provided with one or more hydrophilic layers as disclosed in for example EP 1 025 992 may also be used.

Exposure Step

The printing plate precursor is preferably image-wise exposed by a laser emitting IR light. Preferably, the image-wise exposing step is carried out off-press in a platesetter, i.e. an exposure apparatus suitable for image-wise exposing the precursor with a laser such as a laser diode, emitting around 830 nm or a Nd YAG laser emitting around 1060 nm, a violet laser, emitting around 400 nm, or a gas laser such as an Ar laser, or with a digitally modulated UV-exposure set-up, using e.g. digital mirror devices, or by a conventional exposure in contact with a mask. In a preferred embodiment of the present invention, the precursor is image-wise exposed by a laser emitting IR light or violet light, more preferably by a laser emitting IR light.

Preheat Step

After the exposing step, the precursor may be pre-heated in a preheating unit, preferably at a temperature of about 80° C. to 150° C. and preferably during a dwell time of about 5 seconds to 1 minute. This preheating unit may comprise a heating element, preferably an IR-lamp, an UV-lamp, heated air or a heated roll. Such a preheat step can be used for printing plate precursors comprising a photopolymerisable composition to enhance or to speed-up the polymerization and/or crosslinking reaction.

Development Step

Subsequently to the exposing step or the preheat step, when a preheat step is present, the plate precursor may be processed (developed). Before developing the imaged precursor, a pre-rinse step might be carried out especially for the negative-working lithographic printing precursors having a protective oxygen barrier or topcoat. This pre-rinse step can be carried out in a stand-alone apparatus or by manually rinsing the imaged precursor with water or the pre-rinse step can be carried out in a washing unit that is integrated in a processor used for developing the imaged precursor. The washing liquid is preferably water, more preferably tap water. More details concerning the wash step are described in EP 1 788 434 in [0026].

During the development step, the non-exposed areas of the image-recording layer are at least partially removed without essentially removing the exposed areas. The processing liquid, also referred to as developer, can be applied to the plate e.g. by rubbing with an impregnated pad, by dipping, immersing, coating, spincoating, spraying, pouring-on, either by hand or in an automatic processing apparatus. The treatment with a processing liquid may be combined with mechanical rubbing, e.g. by a rotating brush. During the development step, any water-soluble protective layer present is preferably also removed. The development is preferably carried out at temperatures between 20 and 40° C. in automated processing units.

In a highly preferred embodiment, the processing step as described above is replaced by an on-press processing whereby the imaged precursor is mounted on a press and processed on-press by rotating said plate cylinder while feeding dampening liquid and/or ink to the coating of the precursor to remove the unexposed areas from the support. In a preferred embodiment, supply of dampening liquid and ink is started simultaneously, or only ink can be supplied during a number of revolutions before switching on the supply of dampening liquid. In an alternative embodiment, only dampening liquid is supplied to the plate during start-up of the press and after a number of revolutions of the plate cylinder also the ink supply is switched on.

The processing step may also be performed by combining embodiments described above, e.g. combining development with a processing liquid with development on-press by applying ink and/or fountain.

Processing Liquid

The processing liquid may be an alkaline developer or solvent-based developer. Suitable alkaline developers have been described in US2005/0162505. An alkaline developer is an aqueous solution which has a pH of at least 11, more typically at least 12, preferably from 12 to 14. Alkaline developers typically contain alkaline agents to obtain high pH values can be inorganic or organic alkaline agents. The developers can comprise anionic, non-ionic and amphoteric surfactants (up to 3% on the total composition weight); biocides (antimicrobial and/or antifungal agents), antifoaming agents or chelating agents (such as alkali gluconates), and thickening agents (water soluble or water dispersible polyhydroxy compounds such as glycerine or polyethylene glycol).

Preferably, the processing liquid is a gum solution whereby during the development step the non-exposed areas of the photopolymerisable layer are removed from the support and the plate is gummed in a single step. The development with a gum solution has the additional benefit that, due to the remaining gum on the plate in the non-exposed areas, an additional gumming step is not required to protect the surface of the support in the non-printing areas. As a result, the precursor is processed and gummed in one single step which involves a less complex developing apparatus than a developing apparatus comprising a developer tank, a rinsing section and a gumming section. The gumming section may comprise at least one gumming unit or may comprise two or more gumming units. These gumming units may have the configuration of a cascade system, i.e. the gum solution, used in the second gumming unit and present in the second tank, overflows from the second tank to the first tank when gum replenishing solution is added in the second gumming unit or when the gum solution in the second gumming unit is used once-only, i.e. only starting gum solution is used to develop the precursor in this second gumming unit by preferably a spraying or jetting technique. More details concerning such gum development is described in EP1 788 444.

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such surface protective compounds are film-forming hydrophilic polymers or surfactants. The layer that remains on the plate after treatment with the gum solution preferably comprises between 0.005 and 20 $g/m^2$ of the surface protective compound, more preferably between 0.010 and 10 $g/m^2$, most preferably between 0.020 and 5 $g/m^2$. More details concerning the surface protective compounds in the gum solution can be found in WO 2007/057348 page 9 line 3 to page 11 line 6. As the developed plate precursor is developed and gummed in one step, there is no need to post-treat the processed plate.

The gum solution preferably has a pH value between 3 and 11, more preferably between 4 and 10, even more preferably between 5 and 9, and most preferably between 6 and 8. A suitable gum solution is described in for example EP 1 342 568 in [0008] to [0022] and WO2005/111727. The gum solution may further comprise an inorganic salt, an anionic surfactant, a wetting agent, a chelate compound, an antiseptic compound, an anti-foaming compound and/or an ink receptivity agent and/or combinations thereof. More details about these additional ingredients are described in WO 2007/057348 page 11 line 22 to page 14 line 19.

Drying and Baking Step

After the processing step the plate may be dried in a drying unit. In a
preferred embodiment the plate is dried by heating the plate in the drying unit which may contain at least one heating element selected from an IR-lamp, an UV-lamp, a heated metal roller or heated air.

After drying the plate can optionally be heated in a baking unit. More details concerning the heating in a baking unit can be found in WO 2007/057348 page 44 line 26 to page 45 line 20.

According to the present invention there is also provided a method for making a negative-working lithographic printing plate comprising the steps of imagewise exposing a printing plate precursor followed by developing the imagewise exposed precursor so that the non-exposed areas are dissolved in the developer solution. The development is preferably carried out by treating the precursor with a gum solution, however more preferably by mounting the precursor on a plate cylinder of a lithographic printing press and rotating the plate cylinder while feeding dampening liquid and/or ink to the precursor. Optionally, after the imaging step, a heating step is carried out to enhance or to speed-up the polymerization and/or crosslinking reaction. The lithographic printing plate precursor can be prepared by (i) applying on a support the coating as described above and (ii) drying the precursor. Any coating method can be used for applying one or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

1. Materials

All materials used in the following examples were readily available from standard sources such as SIGMA-ALDRICH, MERCK and ACROS ORGANICS unless otherwise specified.

The adhesion promoting compounds according to the invention used in the examples are summarized in Table 1 below.

TABLE 1

Inventive adhesion promoting compounds (APC-OX)

| Adhesion promoting compound APC-0X | Structure |
|---|---|
| APC-01 | 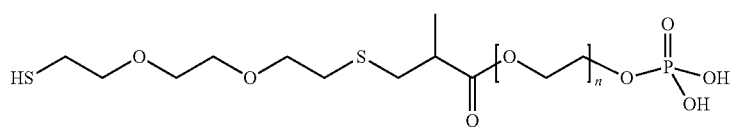 wherein n = 1 to 15 |
| APC-02 | 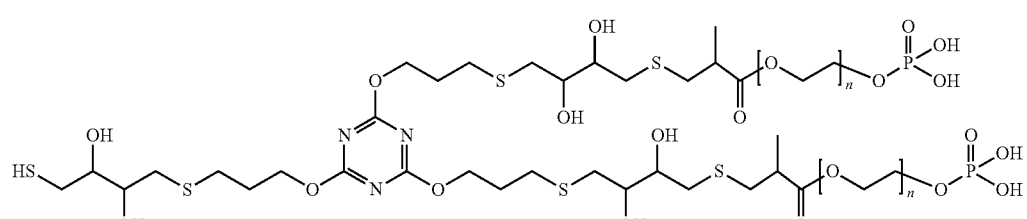 wherein n = 6 |

TABLE 1-continued

Inventive adhesion promoting compounds (APC-OX)

| Adhesion promoting compound APC-0X | Structure |
| --- | --- |
| APC-03 | [structure image] |
| APC-04 | [structure image] wherein n = 8 |
| APC-05 | [structure image] wherein n = 1 |
| APC-06 | [structure image] |

2. Synthesis of the Adhesion Promoting Compounds

Synthesis of APC-01

In a 500 mL 3-neck flask 2.067 g of 3,6-dioxa-1,8-octanedithiol was added to 5.453 g of Sipomer™ PAM100. The mixture was flushed with nitrogen and stirred for 15 minutes at room temperature. The temperature was then brought to 80° C., after which 0.001 g of 2,2'-Azobis(2-methylbutyronitrile) was added. The reaction was left to proceed at 80° C. overnight. Proton NMR analysis reveals that the reaction went to completion and no more Sipomer™ PAM100 is present. The product is used as such.

Synthesis of APC-02

APC-02 was synthesized in a similar way as APC-01 by reacting precursor X with Sipomer™ PAM100 in a 1:2 molar ratio.

Precursor X is prepared as follows:

4,98 g of 2,4,6-Triallyloxy-1,3,5-triazine was added to a 100 mL flask. Next, 9,351 g of DL-1,4-Dithiothreitol was added as well as 0,21 g of BHT. The mixture was then heated to 80° C. while stirring. 0,037 g of 2,2'-Azobis(2-methylbutyronitrile) was added and the mixture was stirred further for 16 hours at 70 ° C. The product was used as such.

Synthesis of APC-03

APC-03 was synthesized in a similar way as APC-01 by reacting trimethylolpropantri(3-mercaptopropionate) with vinyl phosphonic acid in a 1:1 molar ratio.

Synthesis of APC-04

APC-04 was synthesized in a similar way as APC-01 by reacting the trifunctional thiol with CASRN 590678-06-1 (available as Karenz™ MT TPMB from SHOWA DENKO) with Sipomer™ PAM100 in a 1:2 molar ratio.

Synthesis of APC-05

In a 100 mL 3-neck flask 6,185 g of 3,6-dioxa-1,8-octanedithiol was added to a solution of 10 g of SIPOMER PAM4000 in 50 mL MEK. The mixture was flushed with nitrogen and stirred for 15 minutes at room temperature. 0.65 g BHT was added. The temperature was then brought to 60° C., after which 0.003 g of 2,2'-Azobis(2-methylbutyronitrile) was added. The reaction was left to proceed at 75° C. overnight. MEK was then removed under reduced pressure. Proton NMR analysis reveals that the reaction went to completion and no more SIPOMER PAM4000 is present. The product is used as such.

Synthesis of APC-06

In a 100 mL 3-neck flask 4,798 g of 3,6-dioxa-1,8-octanedithiol was added to 3,062 g of vinylphosphonic acid. The mixture was flushed with nitrogen and stirred for 15 minutes at room temperature. The temperature was then brought to 80° C., after which 0.001 g of 2,2'-Azobis(2-methylbutyronitrile) was added. The reaction was left to proceed at 80° C. overnight. Proton NMR analysis reveals that the reaction went to completion and no more vinylphosphonic acid is present. The product is used as such.

Example 1

Preparation of the Printing Plates PP-01 to PP-08

Preparation of the Aluminium Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l SO42− ions and 5 g/l Al3+ ions at a temperature of 37° C. and a current density of about 100 A/dm2. Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm2, then washed with demineralised water for 11 seconds and dried at 120° C. for 5 seconds.

The support thus obtained was characterized by a surface roughness Ra of 0.35-0.4 µm (measured with interferometer NT1100) and had an oxide weight of 3.0 g/m$^2$.

Photopolymerisable Layer

The printing plate precursors PPP-01 to PPP-10 were produced by coating onto the above described support S-01 the components as defined in Table 2 dissolved in a mixture of 34% by weight of MEK and 62% by weight of Dowanol PM (1-methoxy-2-propanol, commercially available from DOW CHEMICAL Company) and 4% by weight of water The coating solution was applied at a wet coating thickness of 30 µm and then dried at 120° C. for 1 minute in a circulation oven.

TABLE 2

Composition of the photosensitive layer

| Ingredients g/m$^2$ | Photolayers PL-01 to PL-08 | Photolayer PL-09 | Photolayer PL-10 |
| --- | --- | --- | --- |
| FST 510 (1) | 250 | 250 | 250 |
| CN 104 (2) | 250 | 250 | 250 |
| Initiator-01 (3) | 61 | — | — |
| Initiator-02 (3) | — | 61 | — |
| Initiator-03 (3) | — | — | 61 |
| Adagio C4 (4) | 19 | 19 | 19 |
| Ruco coat EC4811 (5) | 127 | 127 | 127 |
| Sodium tetraphenyl borate | 15 | 15 | 15 |
| S-lec BL 10 (6) | 124 | 124 | 124 |
| Tegoglide 410 (7) | 1.5 | 1.5 | 1.5 |

TABLE 2-continued

Composition of the photosensitive layer

| Ingredients g/m$^2$ | Photolayers PL-01 to PL-08 | Photolayer PL-09 | Photolayer PL-10 |
| --- | --- | --- | --- |
| Fill disp (8) | 85 | 85 | 85 |
| Disperbyk 162 (9) | 10 | 10 | 10 |
| Sipomer PAM 100 (10) | See Table 3 | See Table 3 | See Table 3 |
| Albitrect CP 30 (11) | 24 | 24 | 24 |
| APC-01 (12) | See Table 3 | — | — |

1) FST 510 is a reaction product from 1 mole of 2,2,4-trimethylhexamethylenediisocyanate and 2 moles of hydroxyethyl-methacrylate commercially available from AZ Electronics as a 82 wt. % solution in MEK;

2) CN 104 is an epoxy acrylate oligomer commercially available from Arkema;

3) Initiator-01 is 4-hydroxyphenyl-tribromomethyl-sulfone, Initiator-02 is (4-tert-butyl-phenyl)-(4-methoxy-phenyl) iodonium tetraphenylborate, and Initiator-03 is phenyl-(4-cumyl-phenyl) iodonium tetraphenylborate 4) Infrared absorbing compound represented by the following structure wherein the R-group substitution is a butyl group:

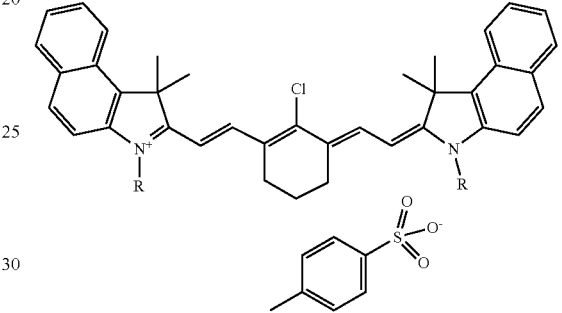

5) Ruco coat EC4811 is a polyether polyurethane commercially available from Rudolf Chemistry;

6) Copolymer of vinyl alcohol, vinyl acetate, vinyl butyral and vinyl acetal from Sekisui Chemical Co. Ltd.

7) Tegoglide 410 is a surfactant commercially available from Evonik Tego Chemie GmbH;

8) Dispersion of 15% AEROSIL R972, commercially available from Degussa, and 5% of BYKJET 9152, commercially available from Altana (BYK CHEMIE GMBH), in methoxypropanol;

9) Disperbyk 162 is commercially available from Altana (BYK Chemie GmbH);

10) Sipomer PAM 100 is a methacrylate phosphonic ester commercially available from Rhodia;

11) Copolymer of polyacrylic acid and polyvinylphosphonic acid (70/30) commercially available from Rhodia;

12) See Table 1;

TABLE 3

The adhesion promoting compounds

| Photolayer | Sipomer-PAM g/m$^2$ | APC-01 g/m$^2$ |
| --- | --- | --- |
| PL-01 | 130 | — |
| PL-02 | 75 | — |
| PL-03 | 50 | — |
| PL-04 | 25 | — |
| PL-05 | — | 130 |
| PL-06 | — | 75 |
| PL-07 | — | 50 |
| PL-08 | — | 25 |
| PL-09 | 50 | — |
| PL-10 | 50 | — |

Protective Overcoat Layer

On top of the photosensitive layer, a solution in water with the compositions as defined in Table 4 were coated (40 µm), and dried at 110° C. for 2 minutes. Printing plate precursors PPP-01 to PPP-10 were obtained (Table 5).

TABLE 4

Composition of the protective overcoat layer OC-01

| INGREDIENTS mg/m² | OC-01 |
|---|---|
| Mowiol 4-88 (1) | 228 |
| Diofan A050 (2) | 227 |
| Ebotec MB SF (3) | 0.5 |
| Lutensol A8 (4) | 9.5 |
| Viomal (5) | 4 |
| Triflaprox (6) | 35.5 |

1) Mowiol 4-88 is a partially hydrolyzed polyvinylalcohols commercially available from Kuraray;
2) Polyvinylidene chloride latex commercially available from Solvay;
3) Biocide commercially available form Bode Chemie GmbH&Co;
4) Lutensol A8 is a surface active agent commercially available from BASF;
5) Viomal is an aqueous dispersion of 20% PV23, commercially available from CLARI-ANT Benelux NV, with 0.02% biocide;
6) IR thermochromic_dye having the following structure

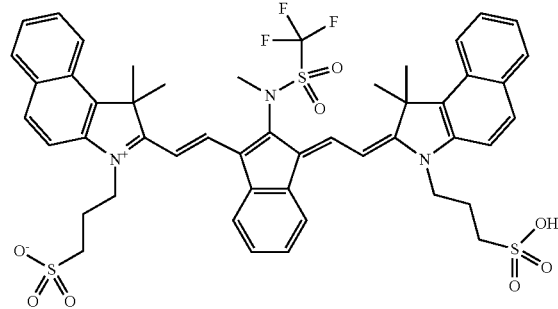 [SMILES: CN(C1=C(/C=C/C2=[N+](CCCS(=O)(=O)[O-])c3ccc4ccccc4c3C2(C)C)c2ccccc2/C1=C\C=C1\N(CCCS(=O)(=O)O)c2ccc3ccccc3c2C1(C)C)S(=O)(=O)C(F)(F)F]

TABLE 5

Printing plate precursors PPP-01 to PPP-10

| Printing Plate Precursor | Photolayer |
|---|---|
| PPP-01 Comparative | PL-01 |
| PPP-02 Comparative | PL-02 |
| PPP-03 Comparative | PL-03 |
| PPP-04 Comparative | PL-04 |
| PPP-05 Inventive | PL-05 |
| PPP-06 Inventive | PL-06 |
| PPP-07 Inventive | PL-07 |
| PPP-08 Inventive | PL-08 |
| PPP-09 Comparative | PL-09 |
| PPP-10 Comparative | PL-10 |

Imaging

The printing plate precursors PPP-01 to PPP-10 were imaged at 2400 dpi with a High Power Creo 40W TE38 thermal platesetterTM (200 lpi Agfa Balanced Screening (ABS)), commercially available from Kodak and equipped with a 830 nm IR laser diode, at an energy density of 130 mJ/cm².

Printing

After imaging, the printing plate precursors PPP-01 to PPP-10 were mounted on a Heidelberg GTO 52 Dalghren printing press. Each print job was started using K+E Skinnex 800 SPEED IK black ink (trademark of BASF Druckfarben GmbH) and 3 wt % Prima FS303 SF (trademark of Agfa Graphics) and 5% isopropanol in water as fountain solution. A compressible blanket was used and printing was performed on non-coated offset paper.

Prior to paper feeding, 10 press revolutions with only the dampening system engaged followed by 5 revolutions with only the inking rollers engaged was performed. Visual assessment of sheets 1-250 was performed to evaluate the image quality.

Test Results

Image Quality

The results of the printing test in terms of image quality are summarized in Table 6.

TABLE 6 results of image quality

| Printing plate | Adhesion Promotor* mg/m² | | Image quality** |
|---|---|---|---|
| | Sipomer PAM | APC-01 | |
| PP-01 comparative | 130 | — | B |
| PP-02 comparative | 75 | — | C |
| PP-03 comparative | 50 | — | D |
| PP-04 comparative | 25 | — | D |
| PP-05 inventive | — | 130 | A |
| PP-06 inventive | — | 75 | A |
| PP-07 inventive | — | 50 | A |
| PP-08 inventive | — | 25 | A |
| PP-09 comparative | 50 | — | D |
| PP-10 comparative | 50 | — | D |

*See Table 2;
**The image wear was visually evaluated after 250 sheets as follows:
A: no image wear,
B: some image wear,
C: many image wear, and
D: severe image wear.

The results in Table 6 show that the image quality of the inventive printing plates including the thiol based adhesion promotor is significantly higher compared to the printing plates including the comparative adhesion promotor. The difference in image quality between the adhesion promoting compounds is more pronounced at low concentration: the images of the comparative printing plates PP-03 and PP-04 including respectively 50 and 25 mg/m² Sipomer PAM, and comparative printing plates PP-10 and PP-11 including 50 mg/m² Sipomer PAM, are completely destroyed whereas the images of the inventive printing plates PP-07 and PP-08 including the inventive adhesion promotor at respectively 50 and 25 mg/m² are unaffected.

Press Life

The printing plates precursors PPP-02, PPP-03, PPP-06 and PPP-07were mounted on a Drent Vision printing press. Each print job was started using coldest flint Eurostar black CS 40 (trademark of Flint Group) and 2.5wt % Prima FS404

AS (trademark of Agfa Graphics) and 2.5% isopropanol in water as fountain solution. A compressible blanket was used and printing was performed on non-coated offset paper. Prior to paper feeding, about 20 press revolutions with both the dampening system and the inking rollers engaged was performed. Visual assessment of sheets 1-50.000 was performed to evaluate the presslife in terms of image strength.

Results

The results of the printing test are summarized in Table 7.

TABLE 7

Presslife evaluation

| PP-0X | Adhesion Promotor | mg/m² | Presslife** |
|---|---|---|---|
| PP-02 comparative | Sipomer PAM | 75 | C |
| PP-03 comparative | Sipomer PAM | 50 | D |
| PP-06 inventive | APC-01 | 75 | A |
| PP-07 inventive | APC-01 | 50 | B |

* See Table 2;
**The presslife was visually evaluated after 50.000 sheets and was relatively scored as follows:
A: practically no image wear,
B: some image wear,
C: much image wear, and
D: severe image wear.

The results in Table 7 show that the presslife of the inventive printing plates PP-06 and PP-07 including the thiol based adhesion promotor is significantly higher compared to the presslife of the comparative printing plates PP-02 and PP-03 including the comparative adhesion promotor.

Example 2

Preparation of Printing Plates PP-11 to PP-15

Photopolymerizable Layer

The photopolymerizable layers PL-11 to PL-15 were produced by coating onto the above described support S-01 the components as defined in Table 8, dissolved in a mixture of 34% by weight of MEK and 62% by weight of Dowanol PM (1-methoxy-2-propanol, commercially available from DOW CHEMICAL Company) and 4% by weight of water. The coating solution was applied at a wet coating thickness of 30 µm and then dried at 120° C. for 1 minute in a circulation oven.

TABLE 8

Composition of the photosensitive layer PL-0X

| Ingredients (1) g/m² | Photolayer |
|---|---|
| FST 510 | 250 |
| CN 104 | 250 |
| Initiator 02 | 61 |
| Adagio C4 | 19 |
| Ruco coat EC4811 | 127 |
| S-Lec BL10 | 124 |
| Tegoglide 410 | 1.5 |
| Fill Disp | 85 |
| Disperbyk 162 | 10 |
| Adhesion Promoting compound | See Table 9 |
| Albritrect CP30 | 24 |

(1) See Table 2;
2) Initiator-02 is (4-methylphenyl)[4-(2-methylpropyl)phenyl]-Iodonium, tetraphenylborate.

TABLE 9

Adhesion promoting compounds

| Photolayer | Sipomer PAM | APC-01* | APC-02* | APC-03* | APC-04* |
|---|---|---|---|---|---|
| PL-11 | 50 | — | | | |
| PL-12 | — | 50 | | | |
| PL-13 | — | — | 50 | | |
| PL-14 | — | — | | 50 | |
| PL-15 | — | | | | 50 |

*See Table 1

Protective Overcoat Layer

On top of the photosensitive layer, a solution in water with the composition as defined in Table 4 above was coated (40 µm wet film), and dried at 110° C. for 2 minutes. Printing plate precursors PPP-11 to PPP-15 were obtained (Table 10).

TABLE 10

Printing plate precursors PPP-11 to PPP-15

| Printing Plate Precursor | Photolayer |
|---|---|
| PPP-11 Comparative | PL-11 |
| PPP-12 Inventive | PL-12 |
| PPP-13 Inventive | PL-13 |
| PPP-14 Inventive | PL-14 |
| PPP-15 Inventive | PL-15 |

Imaging

The printing plate precursors PPP-11 to PPP-15 were imaged at 2400 dpi with a High Power Creo 40W TE38 thermal platesetterTM (200 Ipi Agfa Balanced Screening (ABS)), commercially available from Kodak and equipped with a 830 nm IR laser diode, at an energy density of 130 mJ/cm².

Printing

After imaging, the printing plate precursors PPP-11 to PPP-15 were mounted on a Drent Vision printing press. Each print job was started using coldest flint Eurostar black CS 40 (trademark of Flint Group) and 2.5 wt % Prima FS404 AS (trademark of Agfa Graphics) and 2.5% isopropanol in water as fountain solution. A compressible blanket was used and printing was performed on non-coated offset paper. Prior to paper feeding, about 20 press revolutions with both the dampening system engaged and the inking rollers engaged was performed. Visual assessment of the image was performed after 30.000 printed sheets to evaluate the presslife in terms of image strength.

Presslife Results

The results of the printing test are summarized in Table 11.

TABLE 11

| Presslife evaluation | | |
|---|---|---|
| Printing plate | Adhesion promoting agent | Presslife* |
| PP-11 comparative | Sipomer PAM | D |
| PP-12 inventive | APC-01 | B |
| PP-13 inventive | APC-02 | A |
| PP-14 inventive | APC-03 | A |
| PP-15 inventive | APC-04 | A |

*The presslife was visually evaluated after 30.000 sheets and was relatively scored as follows:
A: practically no image wear,
B: some image wear,
C: much image wear, and
D: severe image wear.

The results in Table 11 show that the presslife of the inventive printing plates PP-12 to PP-15 including the thiol based adhesion promotor is significantly higher compared to the presslife of the comparative printing plate PP-09 including the comparative adhesion promotor.

The invention claimed is:

1. A lithographic printing plate precursor comprising on a substrate, which has a hydrophilic surface or which is provided with a hydrophilic layer, a coating comprising a photopolymerisable layer comprising a polymerisable compound, a photoinitiator, and an adhesion promoting compound containing (i) at least one thiol group and (ii) at least one group selected from a phosphate group and a phosphonate group, which is capable of adhering to the substrate.

2. The printing plate precursor of claim 1, wherein the adhesion promoting compound comprises at least two thiol groups.

3. The printing plate precursor of claim 1, wherein the adhesion promoting compound is of Formula I:

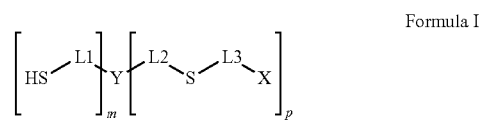

Formula I wherein
m and p each independently represent 1, 2, or 3;
Y represents a z-valent core having 1 to 12 atoms;
z is the sum of m and p and z is 2, 3, 4, or 5;
X represents a phosphate or a phosphonate group; and
L1, L2, and L3 each independently represent a linking group.

4. The printing plate precursor of claim 3, wherein L3 includes —(O—$CH_2$—$CH_2$)o-, wherein o is an integer between 1 and 15.

5. The printing plate precursor of claim 3, wherein the z-valent core represents an optionally substituted carbon atom or an isocyanurate group.

6. The printing plate precursor of claim 1, wherein the adhesion promoting compound has a molecular weight of at least 400 g/mol.

7. The printing plate precursor of claim 2, wherein the adhesion promoting compound has a molecular weight of at least 400 g/mol.

8. The printing plate precursor of claim 3, wherein the adhesion promoting compound has a molecular weight of at least 400 g/mol.

9. The printing plate precursor of claim 1, wherein the adhesion promoting compound has a weight average molecular weight of not more than 5,000 g/mol.

10. The printing plate precursor of claim 2, wherein the adhesion promoting compound has a weight average molecular weight of not more than 5,000 g/mol.

11. The printing plate precursor of claim 3, wherein the adhesion promoting compound has a weight average molecular weight of not more than 5,000 g/mol.

12. The printing plate precursor of claim 1, wherein the adhesion promoting compound is selected from:

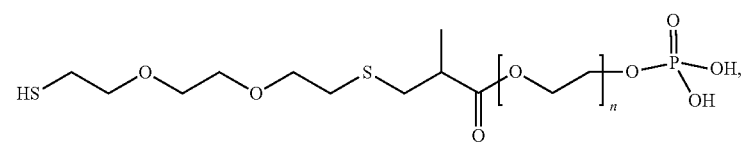

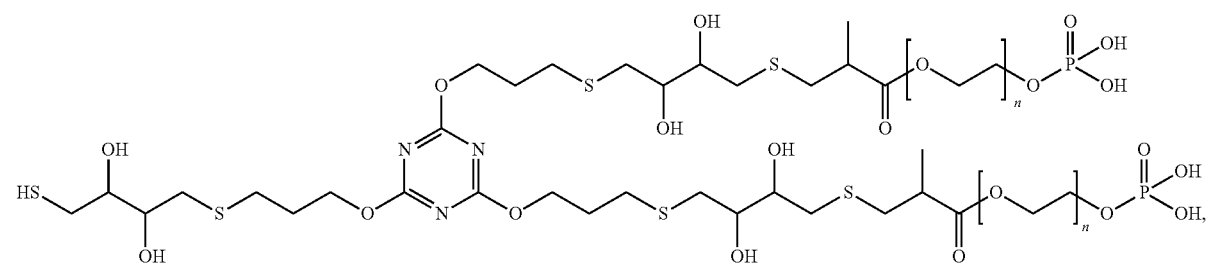

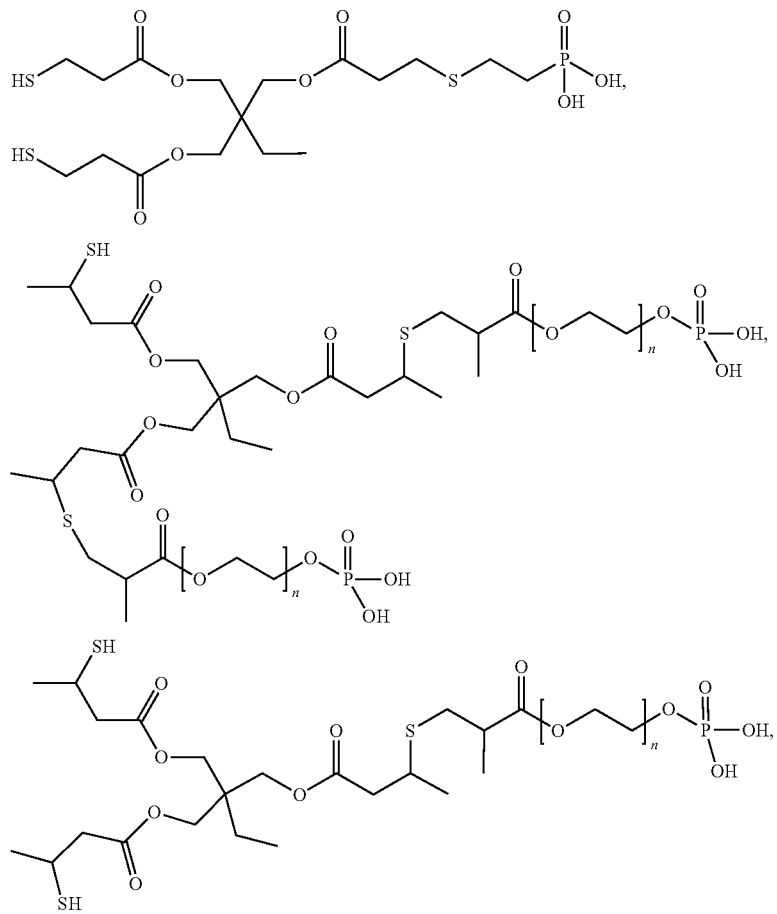
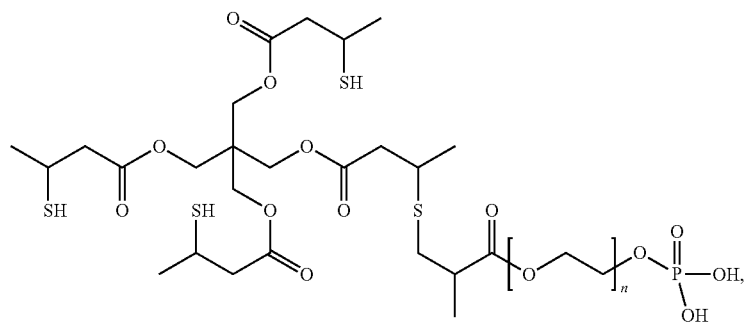
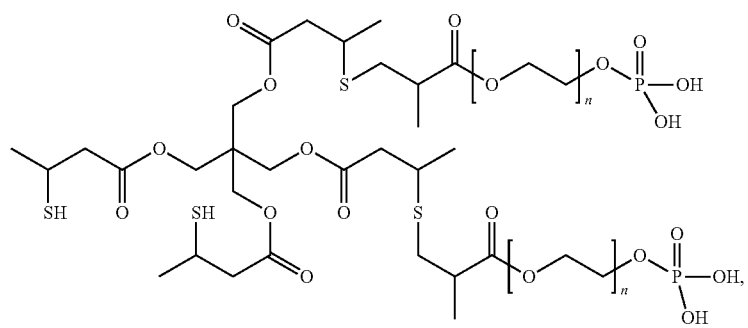

-continued

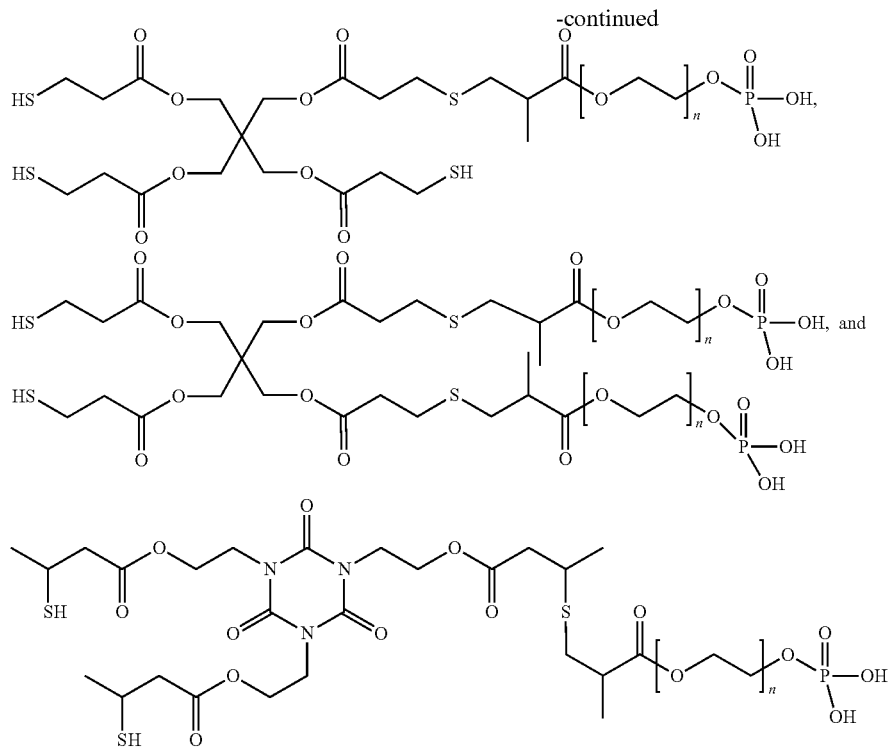

wherein n is 1 to 15.

13. A method for making a printing plate precursor, the method comprising:
coating on a support (i) a photopolymerisable layer including a polymerisable compound, a photoinitiator, and an adhesion promoting compound as defined in claim 1, and
drying the precursor.

14. A method for making a printing plate precursor, the method comprising:
coating on a support (i) a photopolymerisable layer including a polymerisable compound, a photoinitiator, and an adhesion promoting compound as defined in claim 12, and
drying the precursor.

15. A method for making a printing plate, the method comprising:
image-wise exposing the printing plate precursor of claim 1 to heat and/or IR radiation whereby a lithographic image consisting of image areas and non-image areas is formed, and
developing the exposed precursor.

16. The method of claim 15, wherein the precursor is developed by mounting the precursor on a plate cylinder of a lithographic printing press and rotating the plate cylinder while feeding dampening liquid and/or ink to the precursor.

17. The method of claim 15, wherein the precursor is developed by applying a gum solution.

18. A method for making a printing plate, the method comprising:
image-wise exposing the printing plate precursor of claim 12 to heat and/or IR radiation whereby a lithographic image consisting of image areas and non-image areas is formed, and
developing the exposed precursor.

19. The method of claim 18, wherein the precursor is developed by mounting the precursor on a plate cylinder of a lithographic printing press and rotating the plate cylinder while feeding dampening liquid and/or ink to the precursor.

20. The method of claim 18, wherein the precursor is developed by applying a gum solution.

* * * * *